(12) United States Patent
Shirai et al.

(10) Patent No.: US 7,355,862 B2
(45) Date of Patent: Apr. 8, 2008

(54) PRINTED WIRING BOARD, METHOD OF MANUFACTURING THE PRINTED WIRING BOARD, LEAD FRAME PACKAGE, AND OPTICAL MODULE

(75) Inventors: Takehiro Shirai, Tokyo (JP); Masayuki Iwase, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/109,656

(22) Filed: Apr. 20, 2005

(65) Prior Publication Data

US 2005/0208789 A1 Sep. 22, 2005

Related U.S. Application Data

(63) Continuation of application No. PCT/JP2004/002722, filed on Mar. 4, 2004.

(30) Foreign Application Priority Data

Mar. 11, 2003 (JP) .............................. 2003-065475

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................... 361/760; 361/772; 361/774; 361/784

(58) Field of Classification Search ........ 361/772–774, 361/784, 813; 257/660–666, 700–710; 174/259–262
See application file for complete search history.

(56) References Cited

U.S. PATENT DOCUMENTS

| | | | | |
|---|---|---|---|---|
| 4,845,313 A | * | 7/1989 | Endoh et al. | 174/261 |
| 4,949,225 A | * | 8/1990 | Sagisaka et al. | 361/792 |
| 5,483,100 A | * | 1/1996 | Marrs et al. | 257/700 |
| 5,594,626 A | * | 1/1997 | Rostoker et al. | 361/784 |
| 5,869,898 A | * | 2/1999 | Sato | 257/728 |
| 6,531,775 B1 | | 3/2003 | Kobayashi et al. | |
| 2003/0015718 A1 | | 1/2003 | Nakanishi et al. | |
| 2003/0034498 A1 | | 2/2003 | Takagi | |

FOREIGN PATENT DOCUMENTS

| | | |
|---|---|---|
| CA | 2 331 970 | 7/2002 |
| JP | 03-209861 | 9/1991 |
| JP | HEI6-097318 A | 4/1994 |
| JP | 2001-194387 A | 7/2001 |
| JP | 2001-36182 A | 7/2002 |

* cited by examiner

*Primary Examiner*—Tuan T. Dinh
(74) *Attorney, Agent, or Firm*—Oblon, Spivak, McClelland, Maier & Neustadt, P.C.

(57) ABSTRACT

A printed wiring board includes a plurality of conductor plates that includes at least one conductor plate that is used as a lead for electrical connection with an external circuit, the conductor plates being separated spatially from one another; an insulating layer formed on or across the conductor plates or both on and across the conductor plates; and a plurality of wiring patterns formed on the insulating layer. At least one of the conductor plates is electrically connected with at least one of the wiring patterns through a via-hole.

3 Claims, 21 Drawing Sheets

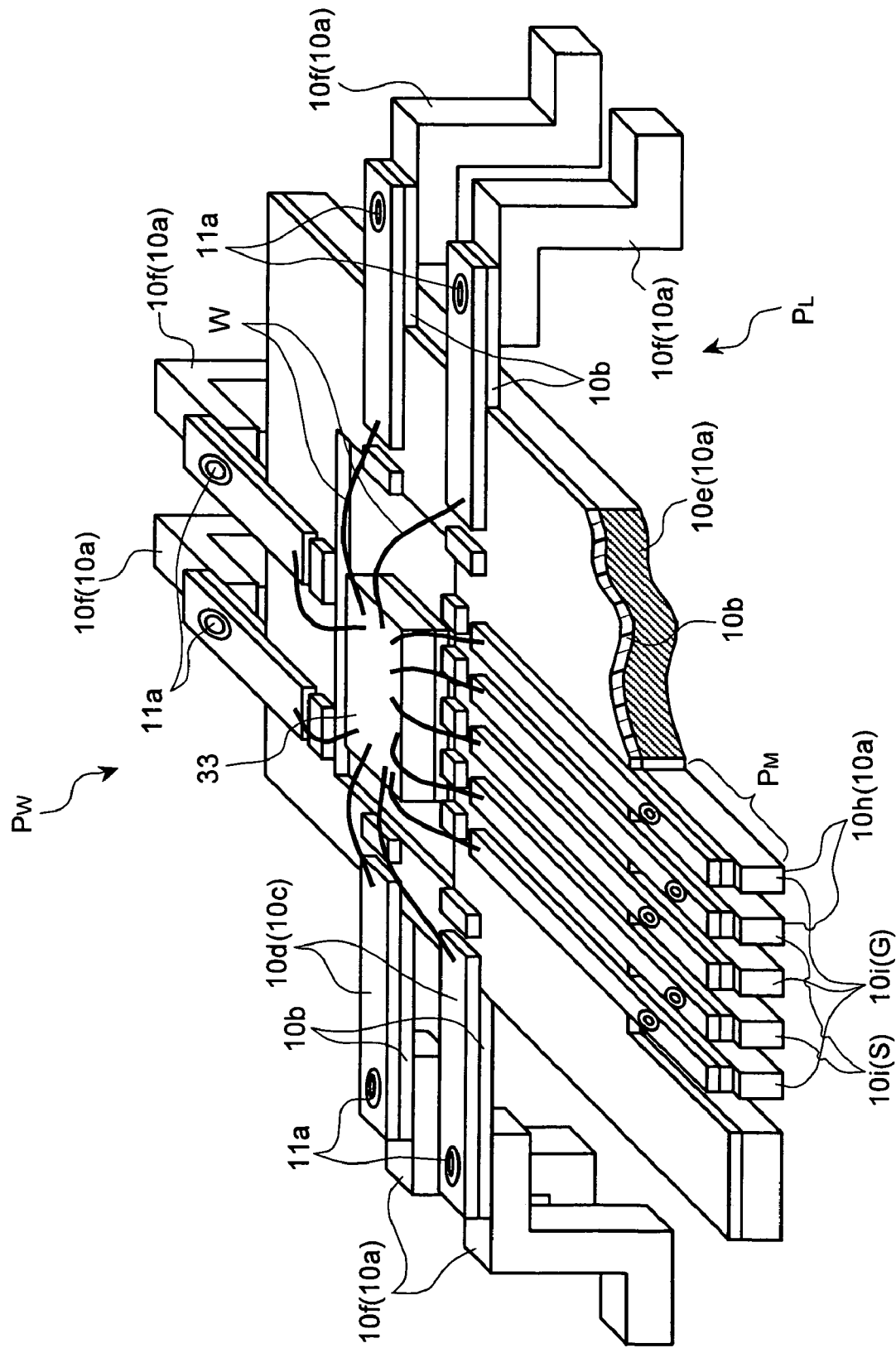

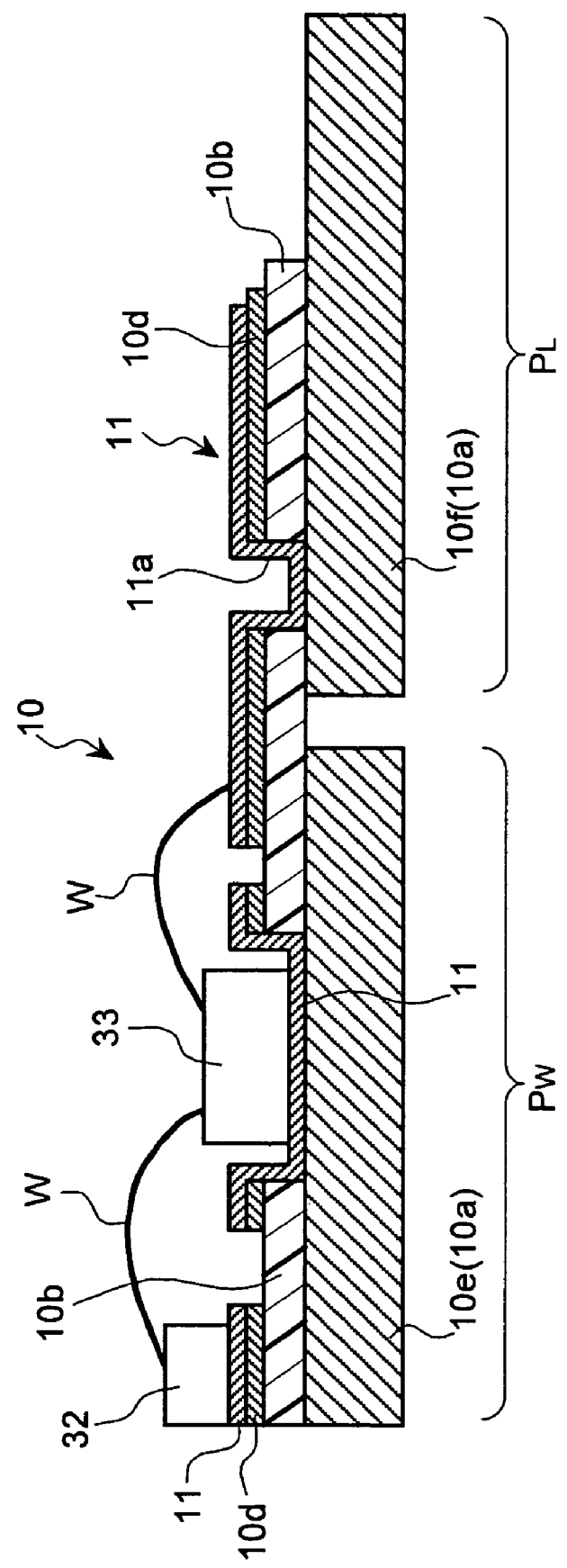

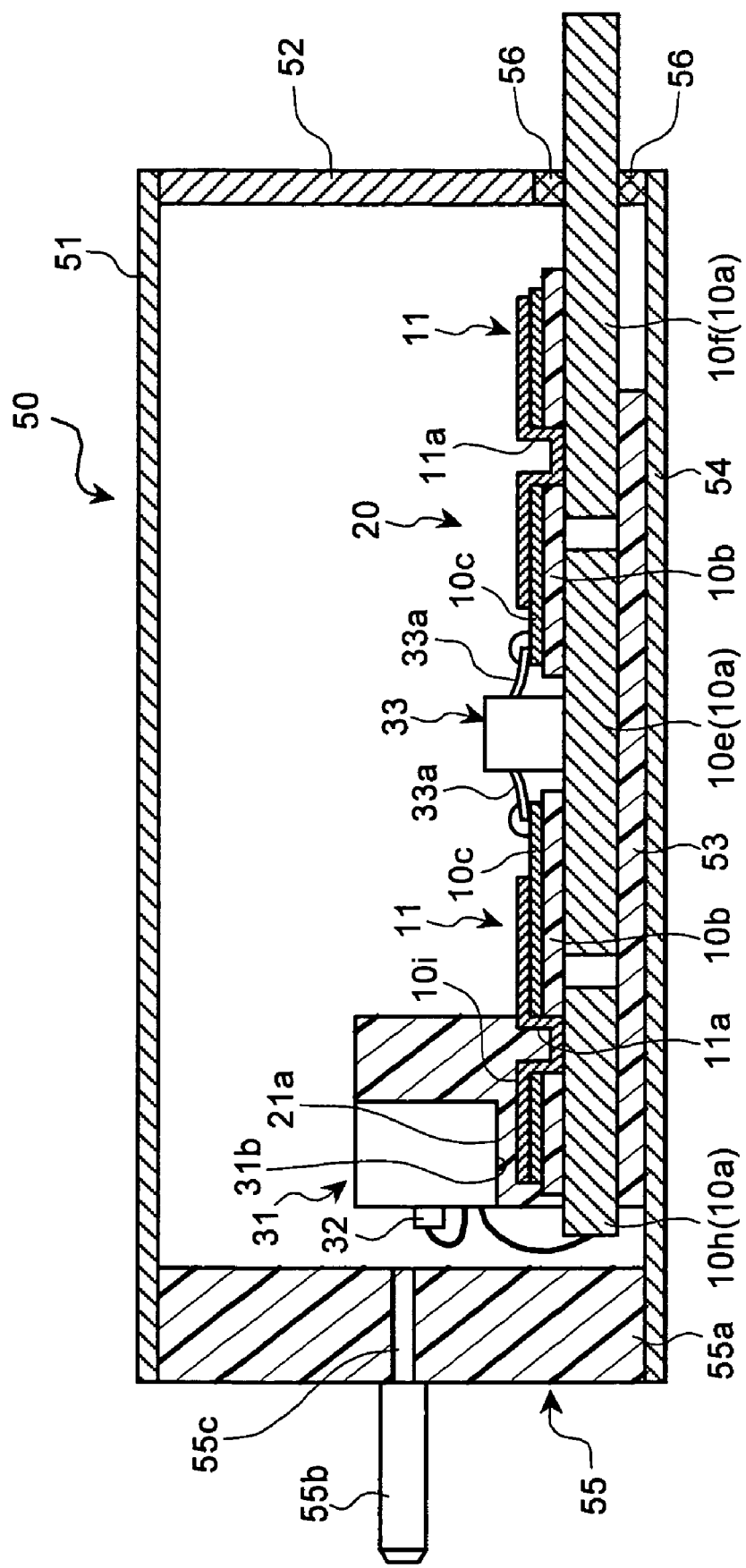

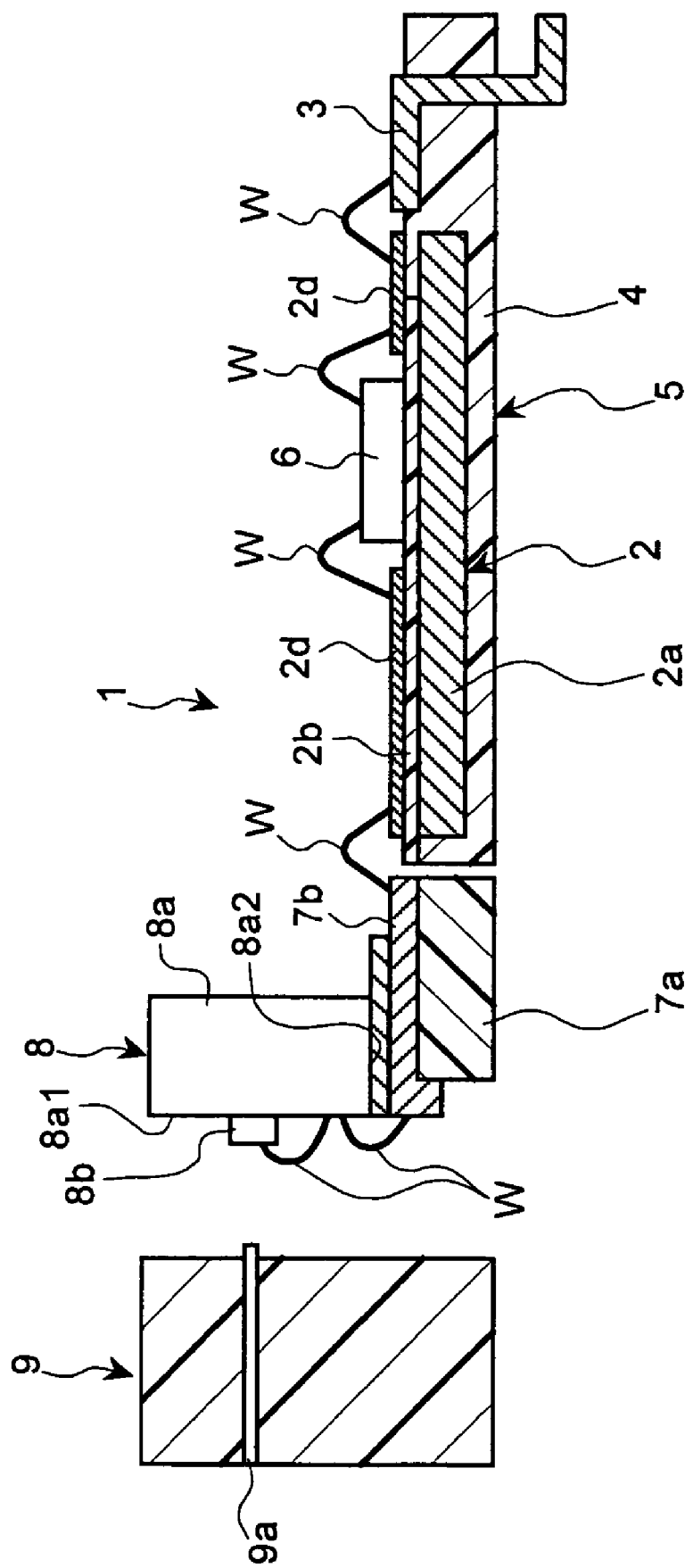

PRINTED WIRING BOARD, METHOD OF MANUFACTURING THE PRINTED WIRING BOARD, LEAD FRAME PACKAGE, AND OPTICAL MODULE

CROSS-REFERENCE TO RELATED APPLICATIONS

This application is a continuation of PCT/JP2004/002722 filed on Mar. 4, 2004, the entire content of which are incorporated herein by reference.

BACKGROUND OF THE INVENTION

1) Field of the Invention

The present invention relates to a printed wiring board, a method of manufacturing the printed wiring board, a lead frame package, and an optical module.

2) Description of the Related Art

Conventionally, a semiconductor device, which is manufactured by connecting mounted semiconductor elements and wiring patterns using bonding wires and sealing the semiconductor elements and the wiring elements with resin, is known (see, for example, Japanese Patent No. 2528192). In addition, in a contact probe in which ends of wiring patterns formed on a surface of a film body project from the film body to be used as contact pins, it is known that the wiring patterns are formed by forming a photoresist layer, the wiring patterns and the contact pins are electrically connected by via-holes, and spaces for providing the via-holes are secured (see, for example, Japanese Patent Application Laid-open No. 2001-194387).

Among such semiconductor devices, for example, an optical module 1 shown in FIG. 22 includes a lead frame package 5, an intermediate member 7a, and a mounting block 8. The optical module 1 is manufactured as a product by connecting these components using bonding wires W and, then, sealing the components with electrically insulating synthetic resin, and integrating the components with a ferrule 9 having an optical fiber 9a.

In this case, in the lead frame package 5, a printed wiring board (PWB) 2 and a lead frame 3 are molded with synthetic resin 4. On the other hand, the printed wiring board 2 has a micro-strip line structure in which an insulating layer 2b and fine wiring patterns 2d including conductor layers are sequentially formed on a conductor plate 2a formed in a predetermined shape. A mounted semiconductor element (an electronic circuit element) 6 and the wiring patterns 2d are connected by the bonding wires W. In the mounting block 8, an optical semiconductor element 8b on which light is made incident and from which light is emitted in a vertical direction with respect to a substrate surface, for example, a planar light receiving and emitting element (a vertical cavity surface emitting laser (VCSEL) or a planar photo diode (PD)) is provided on a silicon substrate 8a. The printed wiring board 2 is adapted to realize impedance matching in the optical module 1 and control deterioration in a signal transmission characteristic by adopting the micro-strip line structure.

When the components are connected by the bonding wires W in the optical module 1, regardless of the fact that the printed wiring board 2 of the micro-strip line structure is used, there is a problem in that a transmission characteristic for a high frequency signal is deteriorated because of an influence of inductance due to a length of the bonding wires W and process man-hour increases. In addition, the printed wiring board 2 and the lead frame 3, which constitute the lead frame package 5, and the intermediate member 7a, which is used with the lead frame package 5, are manufactured separately and then assembled. Thus, there is a problem in that manufacturing cost increases to make the optical module 1 expensive.

In the conventional optical module 1, the planar light receiving and emitting element 8b is fixed to a first surface 8a1 of the mounting block 8, and a conductor plate 7b is fixed on the intermediate member 7a in a surface 8a2 perpendicular to the first surface 8a1. A distal end of the conductor plate 7b is folded vertically downward along a facet of the intermediate member 7a to facilitate work for wire bonding between the conductor plate 7b and the first surface 8a1 of the mounting block 8. An end of the bonding wire W is bonded to this folded portion. Therefore, there is also a problem in that manufacturing cost of the intermediate member 7a increases.

To solve the problems described above, it is an object of the present invention to provide a printed wiring board that can control deterioration in a signal transmission characteristic due to a length of bonding wires by reducing wire bonding sections, can easily perform wire bonding work between the printed wiring board and a planar optical semiconductor element to be mounted, and can be manufactured at low cost, a method of manufacturing the printed wiring board, a lead frame package, and an optical module.

SUMMARY OF THE INVENTION

It is an object of the present invention to solve at least the above problems in the conventional technology.

A printed wiring board according to one aspect of the present invention includes a plurality of conductor plates that has at least one conductor plate to be used as a lead for electrical connection with an external circuit, the plurality of conductor plates being separated spatially from one another; an insulating layer formed on and/or across the plurality of conductor plates; and a plurality of wiring patterns formed on the insulating layer. At least one of the plurality of conductor plates is electrically connected with at least one of the plurality of wiring patterns through a via-hole.

A method of manufacturing a printed wiring board according to another aspect of the present invention includes preparing a substrate having a conductor plate, an insulating layer stacked on the conductor plate, and a conductor layer formed on the insulating layer; forming a plurality of wiring patterns by performing an etching and/or a laser abrasion of at least a predetermined portion of the conductor layer; separating the conductor plate into a plurality of conductor plates by an etching and/or a laser abrasion, thereby leaving the insulating layer and the wiring patterns in a position across the conductor plates separated; and electrically connecting at least one of the wiring patterns with at least one of the conductor plates separated, through a via-hole.

A lead frame package according to still another aspect of the present invention includes a plurality of conductor plates that has at least one conductor plate serving as a lead for electrical connection with an external circuit, the plurality of conductor plates being separated spatially from one another; an insulating layer formed on and/or across the conductor plates; a plurality of wiring patterns formed on the insulating layer; and an electrically-insulating synthetic resin configured to cover a lower surface of at least one of the conductor plates. At least one of the plurality of conductor plates is electrically connected with at least one of the plurality of wiring patterns through a via-hole.

An optical module according to still another aspect of the present invention includes a printed wiring board having a plurality of conductor plates that includes at least one conductor plate serving as a lead for electrical connection with an external circuit, the plurality of conductor plates being separated spatially from one another, an insulating layer formed on and/or across the conductor plates, and a plurality of wiring patterns formed on the insulating layer, wherein at least one of the plurality of conductor plates is electrically connected with at least one of the plurality of wiring patterns through a via-hole; an electrically-insulating synthetic-resin mold case configured to cover a lower surface of at least one of the conductor plates; an optical semiconductor element electrically connected to the wiring patterns; and an optical fiber optically coupled to the optical semiconductor element.

An optical module according to still another aspect of the present invention includes a printed wiring board having a plurality of conductor plates that includes at least one conductor plate serving as a lead for electrical connection with an external circuit, the plurality of conductor plates being separated spatially from one another, an insulating layer formed on and/or across the conductor plates, and a plurality of wiring patterns formed on the insulating layer, wherein at least one of the plurality of conductor plates is electrically connected with at least one of the plurality of wiring patterns through a via-hole; a fixing member configured to fix at least one of the conductor plates thereto, the fixing member having electrical insulating property at least in portions that are electrically in contact with the at least one conductor plates; an optical semiconductor element electrically connected to the wiring patterns; and an optical fiber optically coupled to the optical semiconductor element.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 13 is a perspective view of a printed wiring board, an electronic circuit component, a bonding wire, a lead, and an electrode strip with the sealing synthetic resin and a metal plating layer removed in the optical module according to the third embodiment;

FIG. 17 is a sectional view of an example of mounting of an edge emitting optical semiconductor element in a printed wiring board including only a wiring section and a lead section;

FIG. 21 is a sectional view of an optical module according to a fourth embodiment of the present invention; and FIG. 22 is a sectional view of a structure of a conventional optical module.

DETAILED DESCRIPTION

Exemplary embodiments of a printed wiring board, a method of manufacturing the printed wiring board, a lead frame package, and an optical module according to the present invention will be explained in detail with reference to the drawings.

Figure 1:
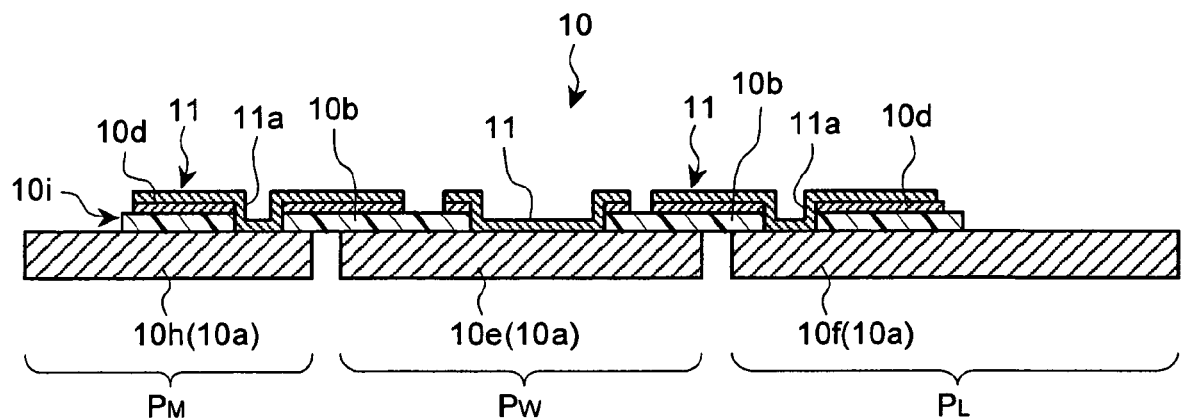
FIG. 1 is a sectional view of a printed wiring board according to a first embodiment of the present invention.
Figure 2:
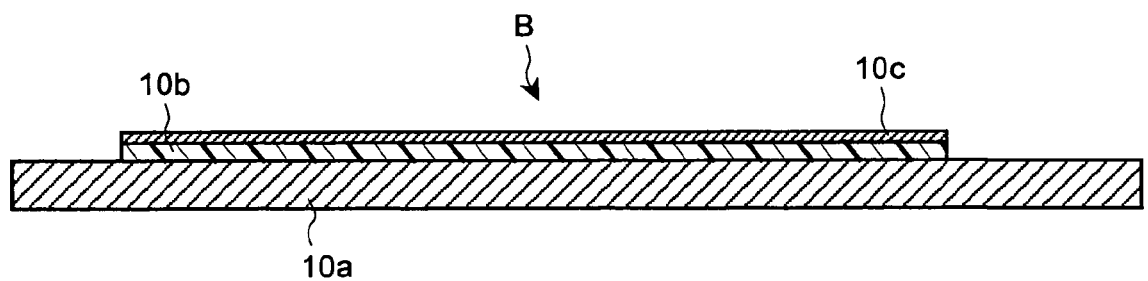
FIG. 2 is a sectional view of a substrate that is used for manufacturing the printed wiring board according to the first embodiment of the present invention.
Figure 3:
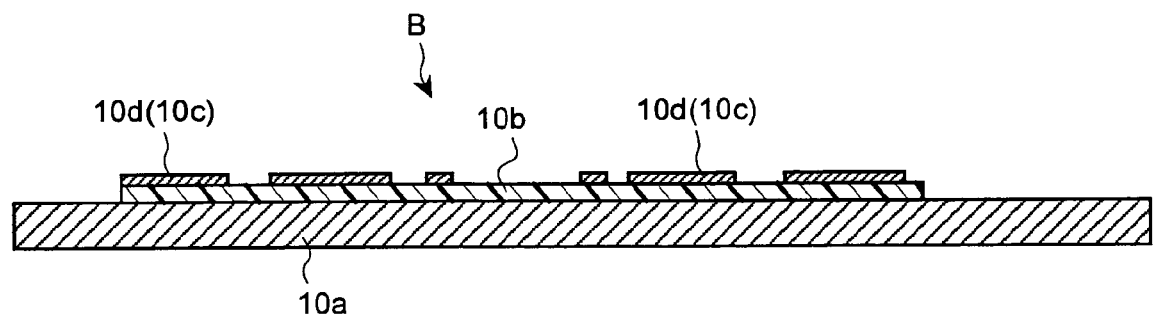
FIG. 3 is a sectional view explaining a method of manufacturing the printed wiring board according to the first embodiment of the present invention in a state in which a conductor layer of the substrate is etched to form a wiring pattern.
Figure 4:
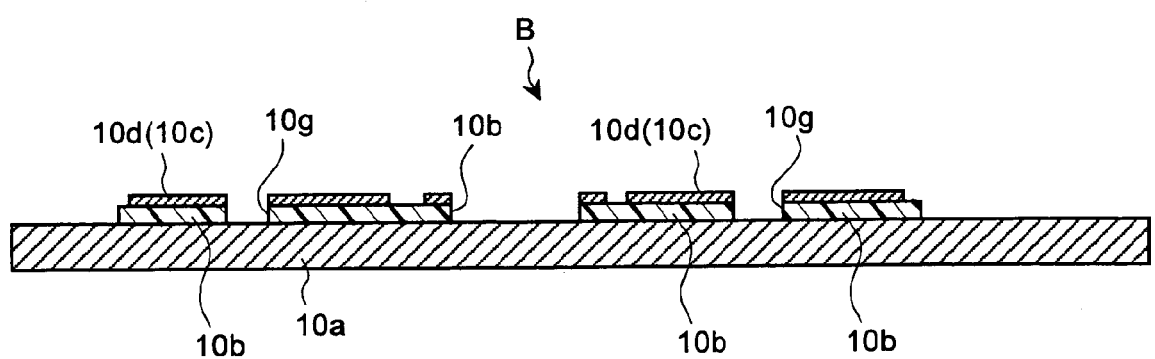
FIG. 4 is a sectional view explaining the method of manufacturing the printed wiring board according to the first embodiment of the present invention in a state in which an insulating layer of the substrate is removed by any one of etching and laser abrasion or both to form a recess for a via-hole.
Figure 5:
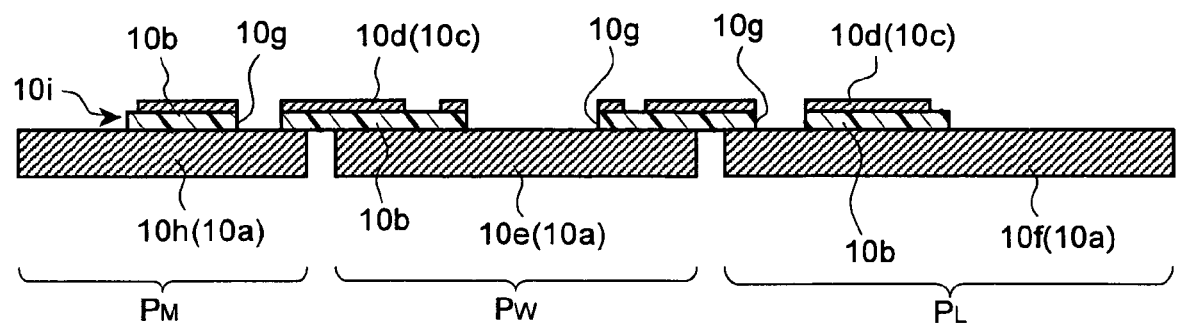
FIG. 5 is a sectional view explaining the method of manufacturing the printed wiring board according to the first embodiment of the present invention in a state in which the conductor plate of the substrate is etched to be separated into a wiring section ground, plural leads, and plural electrode strips.

FIG. 1 is a sectional view of the printed wiring board according to a first embodiment of the present invention. FIG. 2 is a sectional view of a substrate that is used for manufacturing the printed wiring board. FIGS. 3 to 5 are sectional views explaining a method of manufacturing the printed wiring board.

Note that, in FIGS. 1 to 5, a section of one unit of a printed wiring board is shown. When a printed wiring board is actually manufactured, processing to be explained below is collectively performed for a printed wiring board in which the one unit of the printed wiring board shown in these figures is repeatedly provided two-dimensionally for plural units (in the figures, plural units of the printed wiring board extend to one of the left to right direction and the front to back direction or both).

As shown in FIG. 1, a printed wiring board 10 includes a wiring section PW, a lead section PL, and a mounting section PM on which plural wiring patterns 10d of a micro-strip line structure consisting of a conductor layer are formed on an upper surface of a conductor plate 10a via an insulating layer 10b. The printed wiring board 10 is manufactured by machining a substrate B shown in FIG. 2, in which a conductor layer 10c is integrally formed on the conductor plate 10a via the insulating layer 10b, with any one of etching and laser or both. The conductor plate 10a is separated into a wiring section ground 10e, plural leads 10f, and plural conductor plate strips 10h by any one of etching and laser abrasion or both. On the other hand, in the plural wiring patterns 10d, via-holes 11a, which are connected to the leads 10f and the conductor plate strips 10h by metal plating layers 11 formed in desired wiring patterns 10d, are formed. In this case, through-holes may be used instead of the via-holes 11a to, for example, electrically connect the leads 10f and the conductor plate strips 10h.

Here, the substrate B is obtained by compression-bonding a conductor plate 10a consisting of copper, copper alloy, or iron-nickel alloy like 42 alloy, an insulating layer 10b consisting of an insulating member, which consists of an elastic body, a solid body, a composite of the elastic body and the solid body, or the like, for example, a polyimide sheet, and a conductor layer 10c consisting of a conductor, for example, a copper foil with press without using an adhesive. A thickness of the conductor plate 10a is about 0.2 millimeter, a thickness of the insulating layer 10b is 30 micrometers, and a thickness of the conductor layer 10c is 20 micrometers. The respective thicknesses of the conductor plate 10a, the insulating layer 10b, and the conductor layer 10c are changed according to circumstances taking into account desired characteristic impedance, a dielectric constant of the insulating layer 10b, and the like.

In manufacturing the printed wiring board 10 of the present invention, first, photoresist masks are formed on the entire lower surface and sides of the conductor plate 10a and a surface of the conductor layer 10c, which changes to the wiring patterns 10d, and the conductor layer 10c in an exposed portion is etched by an etching solution. Consequently, in the substrate B, the wiring patterns 10d shown in FIG. 3 are formed and the insulating layer 10b is exposed partially. Next, a photoresist mask is formed on the exposed insulating layer 10b excluding a portion where a via-hole is formed, and the insulating layer 10b is removed by etching or laser ablation using hydrazine. Consequently, as shown in FIG. 4, in the substrate B, recesses 10g reaching the conductor plate 10a are formed on the insulating layer 10b. Note that the etching solution is selected arbitrarily according to a kind of target metal, an etching temperature, time, and the like. For example, when metal is copper or copper alloy, the etching solution is ferric chloride solution or the like. Plural kinds of etching solutions may be used properly to etch a predetermined portion of the substrate B. Here, the etching may be dry etching.

Subsequently, the entire upper surface, where the wiring patterns 10d are formed, and appropriate sections of the lower surface of the conductor plate 10a are masked with photoresist, and the lower surface of the conductor plate 10a is etched with the etching solution. Consequently, as shown in FIG. 5, the conductor plate 10a is separated into a first portion on the lead section PL side, a second portion on the wiring section PW, and a third portion on the mounting section PM side. At this point, in the first portion on the lead section PL side, portions between the adjacent leads 10f are simultaneously etched to be removed and plural leads 10f are formed. In addition, in the third portion on the mounting section PM side, plural conductor plate strips 10h are formed. Thereafter, a copper plating layer 11 is formed on the desired wiring patterns 10d and the recesses 10g in the substrate B to form via-holes 11a that electrically connect the wiring patterns 10d and the leads 10f or the wiring patterns (electrode patterns) 10d and the conductor plate strips 10h. In this way, the printed wiring board 10 shown in FIG. 1 is manufactured.

As described above, the printed wiring board 10 of the present invention is manufactured by etching or laser abrasion the substrate B in which the conductor layer 10c is integrally formed on the conductor plate 10a via the insulating layer 10b. The printed wiring board 10 includes the lead section PL in which the plural leads 10f are formed, the wiring section PW including the plural wiring patterns 10d consisting of the micro-strip line, and the mounting section PM including the conductor plate strips 10h and plural electrode strips 10i, which include the insulating layer 10b and the wiring patterns (the electrode patterns) 10d, on the conductor plate strips 10h. The leads 10f and the wiring patterns (the electrode patterns) 10d corresponding to the leads 10f and the conductor plate strips 10h and the wiring patterns (the electrode patterns) 10d corresponding to the conductor plate strips 10h are electrically connected by the via-holes 11a, respectively. Consequently, in the printed wiring board 10, wire bonding between the leads 10f and the wiring patterns 10d or the conductor plate strips 10h and the wiring patterns (the electrode patterns) 10d is made unnecessary. Thus, the printed wiring board 10 is not susceptible to limitation of a signal transmission characteristic due to fluctuation or the like in a length of bonding wires and is inexpensive because it is possible to form the wiring section PW, the lead section PL, and the mounting section PM from a single substrate simultaneously.

Note that, in the printed wiring board 10 according to the first embodiment, the plural wiring patterns 10d are formed as a micro-strip line having the wiring section ground (the second portion) 10e. However, the plural wiring patterns 10d may be formed as a coplanar transmission path with a ground having the wiring section ground 10e in which a ground wiring pattern connected to the wiring section ground 10e is arranged between two signal transmission paths.

Figure 6:
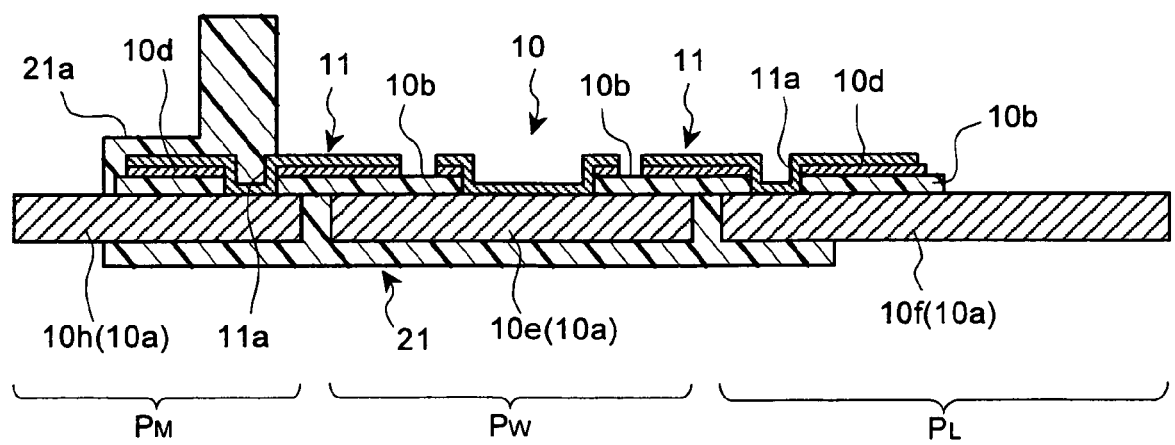
FIG. 6 is a sectional view explaining a method of manufacturing a lead frame package according to a second embodiment of the present invention in a state in which the printed wiring board in FIG. 1 is molded with synthetic resin.
Figure 7:
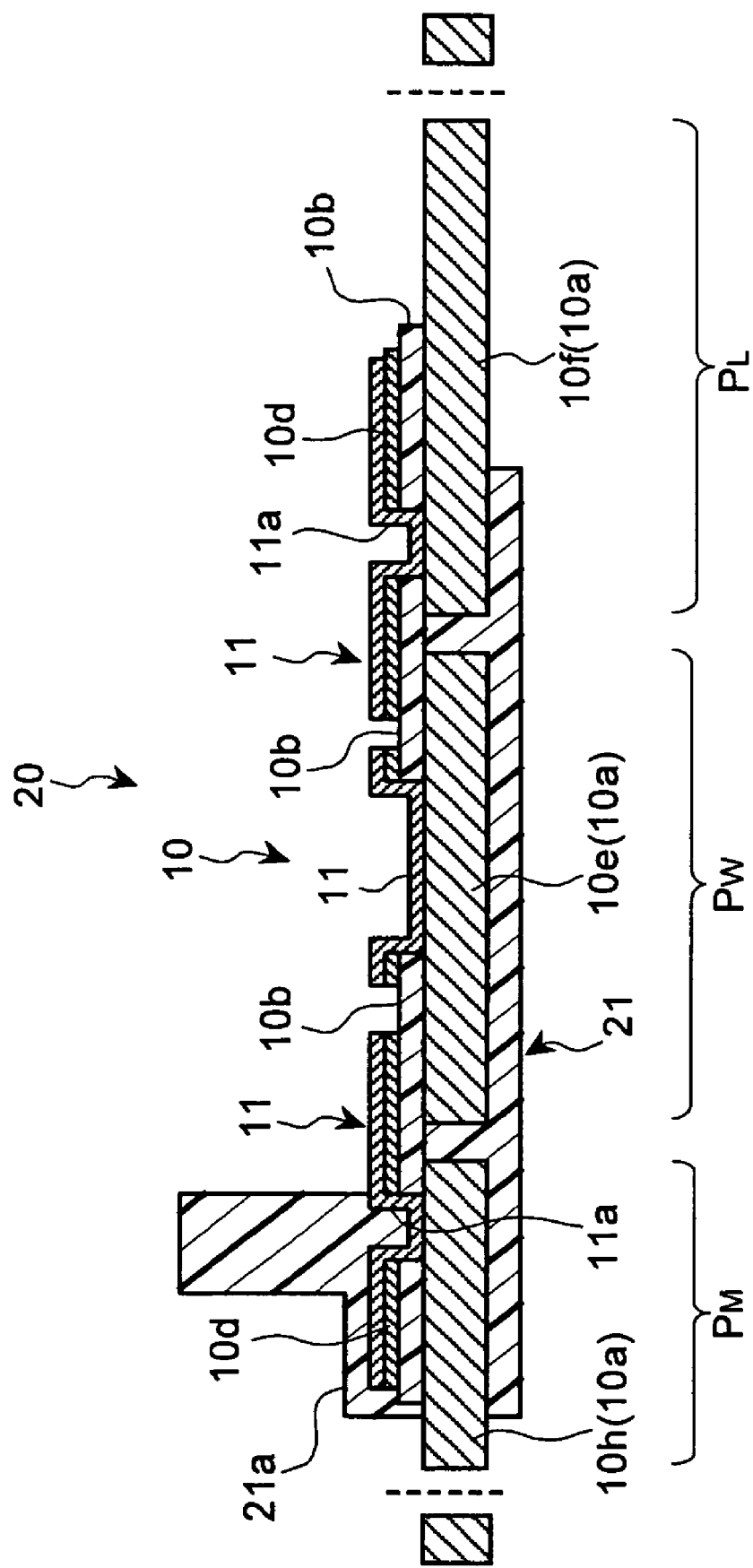
FIG. 7 is a sectional view of a state in which a lead and a conductor plate strip are cut into desired lengths from the printed wiring board molded with synthetic resin to obtain a lead frame package.

FIG. 6 is a sectional view of a method of manufacturing the lead frame package according to a second embodiment of the present invention in a state in which the printed wiring board 10 is molded with synthetic resin. FIG. 7 is a sectional view of a state in which the lead 10f and the conductor plate strip 10h are cut into desired lengths from the printed wiring board 10 molded with synthetic resin to obtain a lead frame package.

A lead frame package 20 according to the second embodiment of the present invention is manufactured from the printed wiring board 10 including the lead section PL and the mounting section PM described in the first embodiment. First, as shown in FIG. 6, the lower surface of the conductor plate 10a and the mounting section PM of the printed wiring board 10 are wrapped by insert mold using synthetic resin 21 like polyphenylene sulfide (PPS) resin or polybutylene terephthalate (PBT) resin having electrical insulating properties and thermoplasticity or epoxy resin having electrical insulating properties and thermoplasticity. At this point, a stepped portion 21a for mounting a mounting block to be described later is formed of the synthetic resin 21 in an upper portion of the mounting section PM of the printed wiring board 10.

Then, as indicated by dotted lines in FIG. 7, after cutting the plural leads 10f and the plural conductor plate strips 10h extending from the synthetic resin 21 into desired lengths, cut facets of the leads 10f and the 10h are polished and plated with Au to obtain the lead frame package 20.

In this way, the lead frame package 20 is manufactured by molding the printed wiring board 10 according to the first embodiment with the synthetic resin 21, cutting the leads 10f and the conductor plate strips 10h into desired lengths, and polishing and plating the cut faces. Therefore, the lead frame package 20 can be machined easily and manufactured at low cost. In addition, since wire bonding sections can be reduced, impedance characteristics of the lead frame package 20 are stable.

Figure 8:
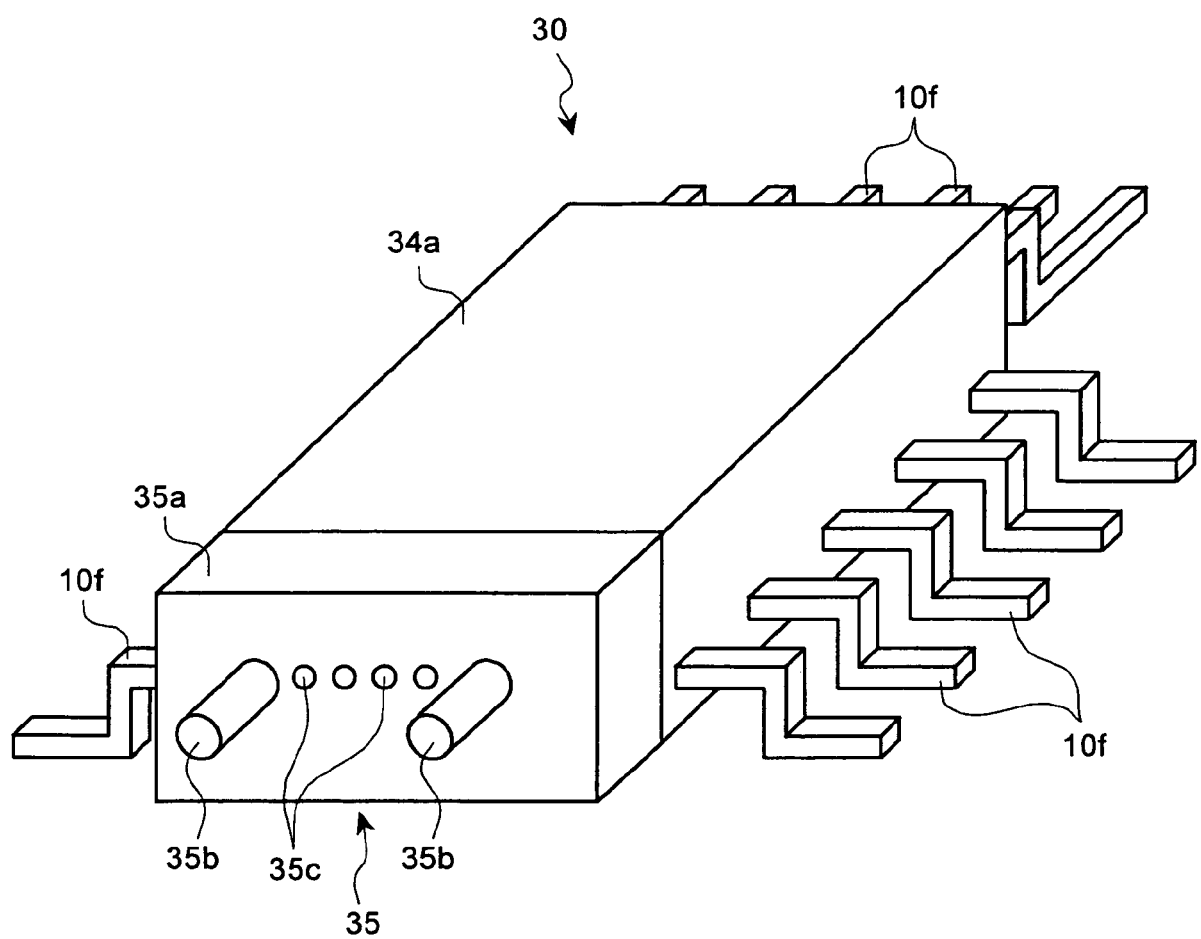
FIG. 8 is a perspective view of an optical module according to a third embodiment of the present invention.
Figure 9:
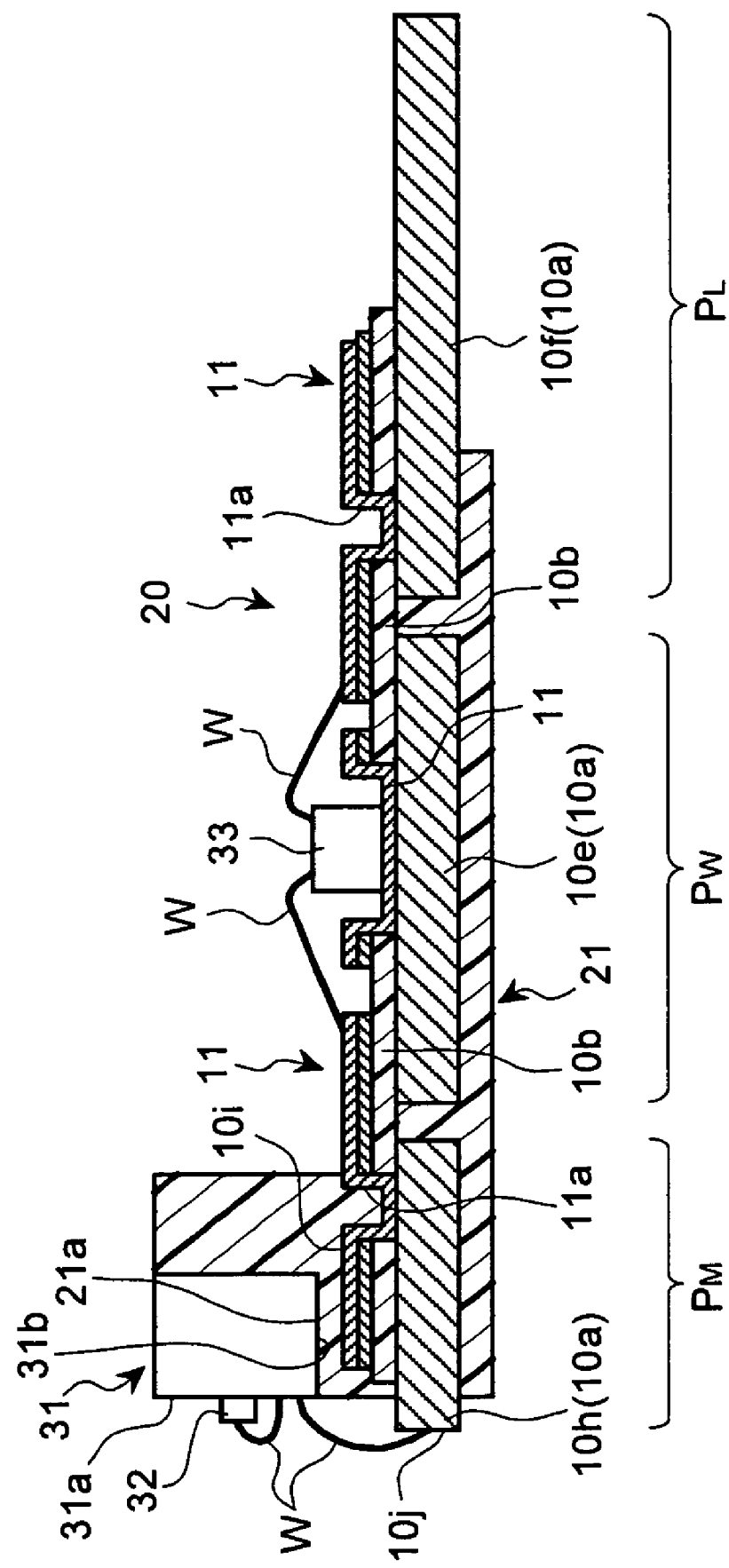
FIG. 9 is a sectional view of the lead frame package shown in FIG. 7 mounted with a multi-channel optical semiconductor element and an electronic circuit component (a semiconductor element) for driving.
Figure 10:
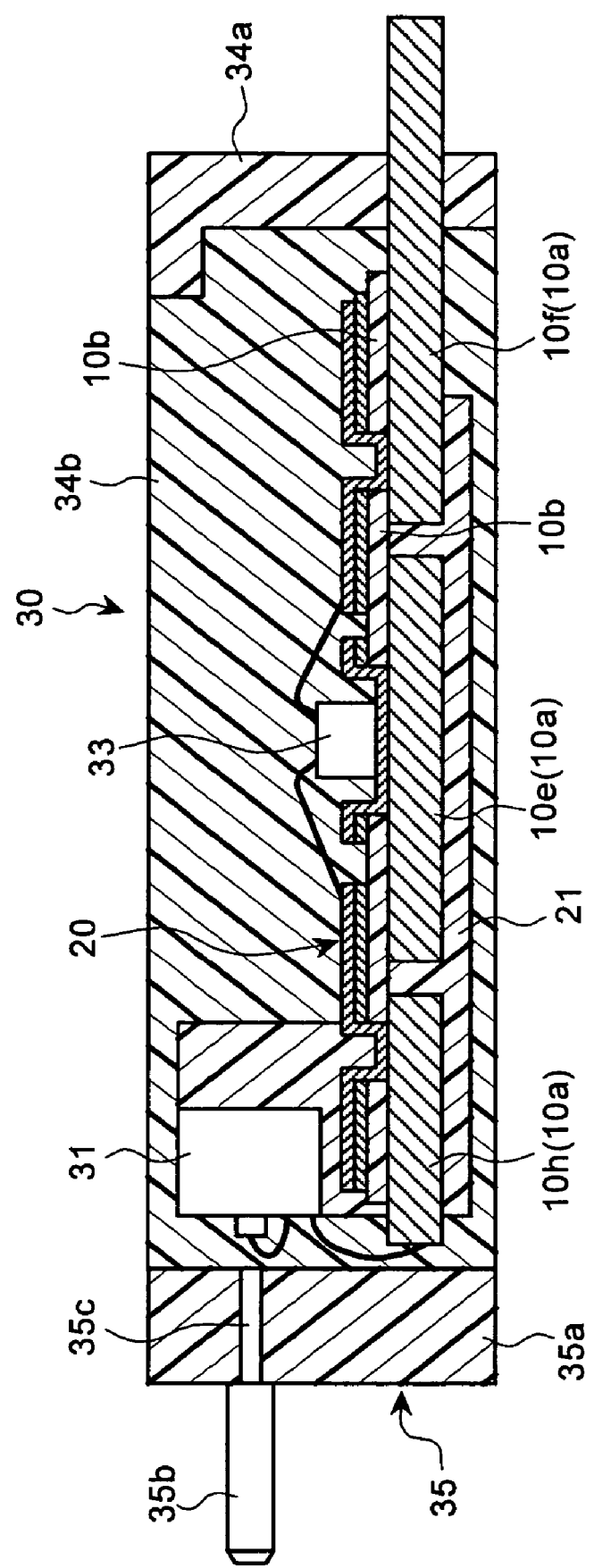
FIG. 10 is a sectional view of an optical module constituted by joining a lead frame package, which is sealed with electrically insulating synthetic resin, and a ferrule.

FIG. 8 is a perspective view of an optical module 30 according to a third embodiment of the present invention. FIG. 9 is a sectional view of the lead frame package 20 shown in FIG. 7 mounted with a multi-channel optical semiconductor element 32 and an electronic circuit component (a semiconductor element) for driving 33. FIG. 10 is a sectional view of the optical module 30 constituted by joining the lead frame package 20, which is sealed with electrically insulating synthetic resin, and a ferrule 35.

The optical module 30 includes four optical semiconductor elements 32 arranged in a row. As shown in FIG. 8, the lead frame package sealed with a synthetic resin case 34a and the ferrule 35 are joined and the plural leads 10f extending laterally are bent. In the ferrule 35, guide pins 35b are provided and four optical fibers 35c, which correspond to the four optical semiconductor elements 32 arranged in a row, are arranged in a row in a body 35a.

As the optical semiconductor element 32, a planar light receiving and emitting element array (VCSEL or PD) or the like, on which light is made incident and from which light is emitted in a vertical direction with respect to a substrate surface thereof, is used. In manufacturing the optical module 30, first, as shown in FIG. 9, the four optical semiconductor elements 32 are fixed in a row on a first surface 31a of a mounting block (a silicon substrate) 31 set in the stepped portion 21a of the lead frame package 20, and a second surface 31b perpendicular to the first surface 31a and the stepped portion 21a are fixed to be opposed to each other. Consequently, the substrate surface of each of the optical semiconductor elements 32 is perpendicular to the upper surface of the conductor plate 10a. The electronic circuit component for driving 33 like an IC is provided on the metal plating layer 11 of the wiring section PW. Then, the mounting block 31 and the respective optical semiconductor elements 32, the mounting block 31 and the conductor plate strip 10h, and the electronic circuit components 33 and the metal plating layers 11 in two sections are connected by the bonding wire W, respectively.

Note that, although not shown in the figure, a wiring pattern, which is required for electrically connecting with the optical semiconductor elements 32, is formed on the first surface 31a of the mounting block 31. The respective optical semiconductor elements 32 and the conductor plate strip 10h are electrically connected via this wiring pattern. Then, the bonding wire, which connects the wiring pattern on the first surface 31a of the mounting block 31 and the conductor plate strip 10h, is connected to a facet 10j, which is substantially parallel to the first surface 31a of the mounting block 31, on the conductor plate strip 10h side.

Next, as shown in FIG. 10, the optical semiconductor elements 32 and the electric circuit component 33 fixed on the lead frame package 20 are surrounded by the synthetic resin case 34a. The ferrule 35, to which the plural optical fibers 35c corresponding to respective channels of the four optical semiconductor elements 32 are fixed, is joined with the synthetic resin case 34a such that the respective optical fibers 35c are optically coupled to the respective channels of the four optical semiconductor elements 32. At this point, the plural leads 10f of the lead section PL of the lead frame package 20 are extended from the synthetic resin case 34a by a predetermined length. Then, synthetic resin 34b is filled in an inside space surrounded by the synthetic resin case 34a and the lead frame package 20. Note that the ferrule 35 has two guide pins 35b for positioning with a multi-core connector 42 (see FIG. 12A) in the body 35a.

Figure 11A:
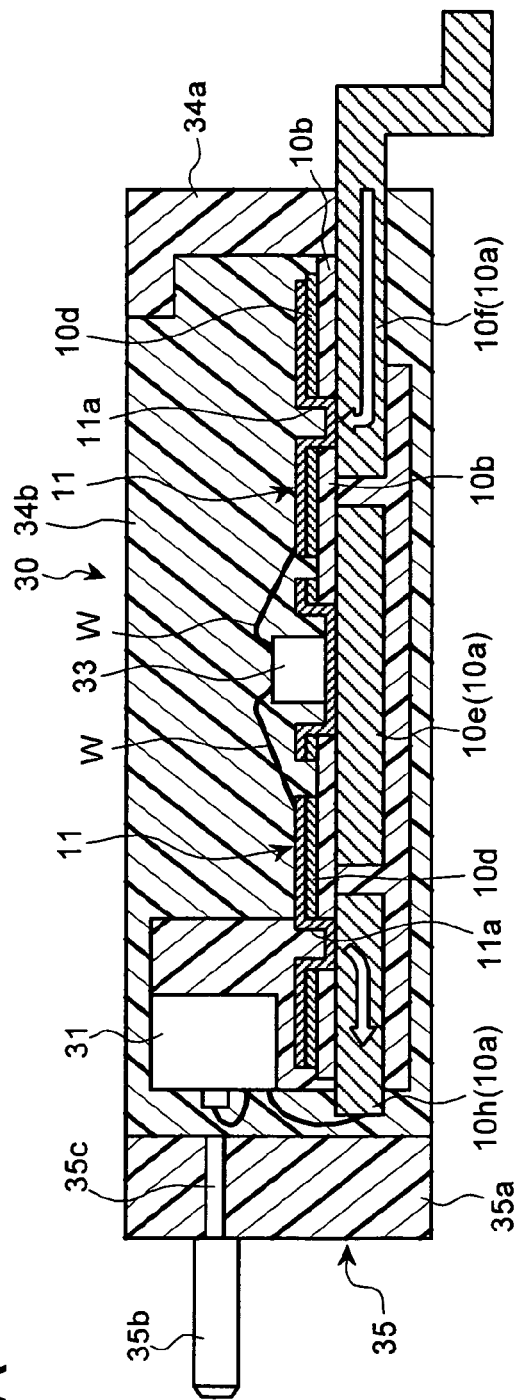
FIG. 11A is a sectional view of an optical module that is manufactured by bending leads in the lead frame package in FIG. 10 sealed with synthetic resin.
Figure 11B:
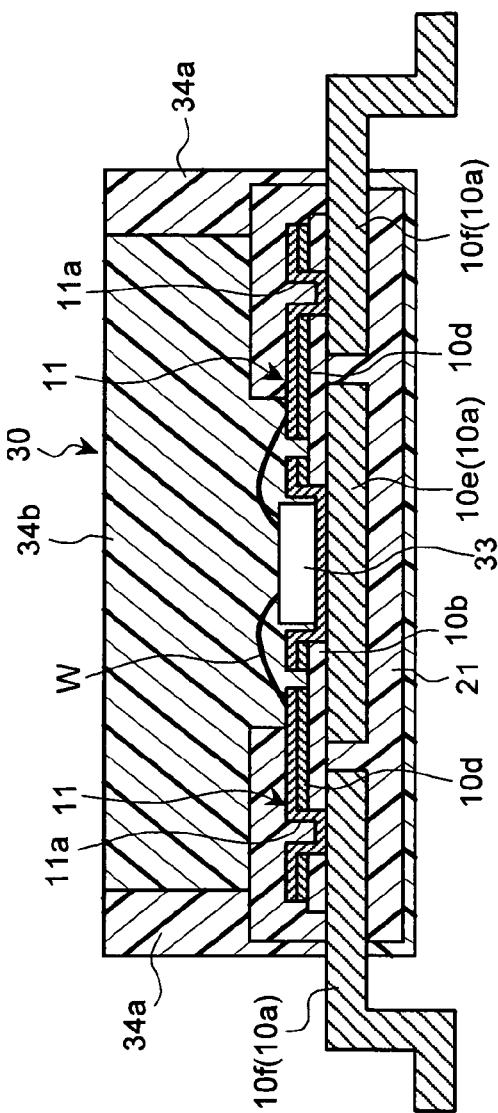
FIG. 11B is a sectional view along a width direction in the optical module in FIG. 11A.
Figure 12A:
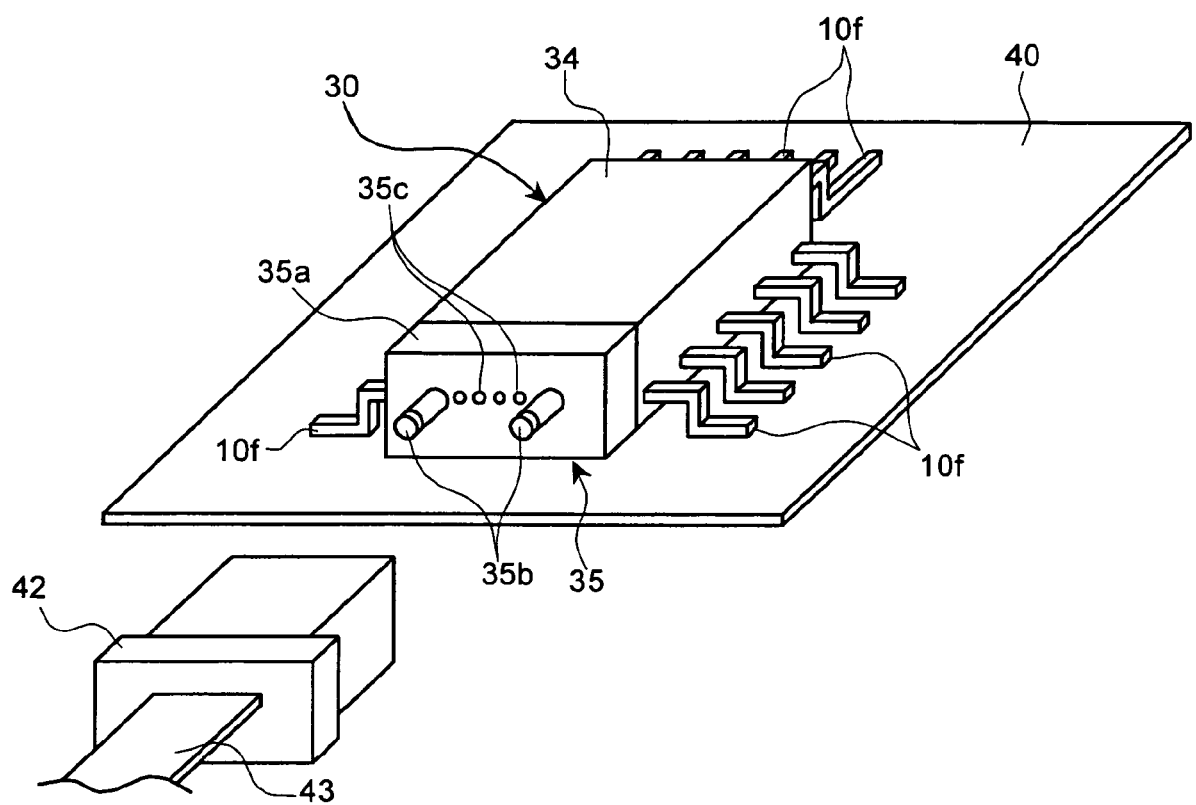
FIG. 12A is a perspective view of a state of use of the optical module shown in FIG. 11.

Subsequently, as shown in FIG. 11A, which shows a cross section along a longitudinal direction in FIG. 10, and FIG. 11B, which shows a cross section along a width direction in FIG. 10, the leads 10f extended from the synthetic resin case 34a are bent in positions set in advance to complete the manufacturing of the optical module 30. As shown in FIG. 12A, the optical module 30 manufactured in this way is mounted on a circuit board 40 on which a predetermined circuit is formed. The optical module 30 is electrically connected to the predetermined circuit via the respective leads 10f and connected to the multi-core connector 42 using the guide pins 35b. Consequently, in the optical module 30, the four optical semiconductor elements 32 and optical fibers corresponding thereto of a ribbon type optical fiber 43 are optically coupled.

Figure 12B:
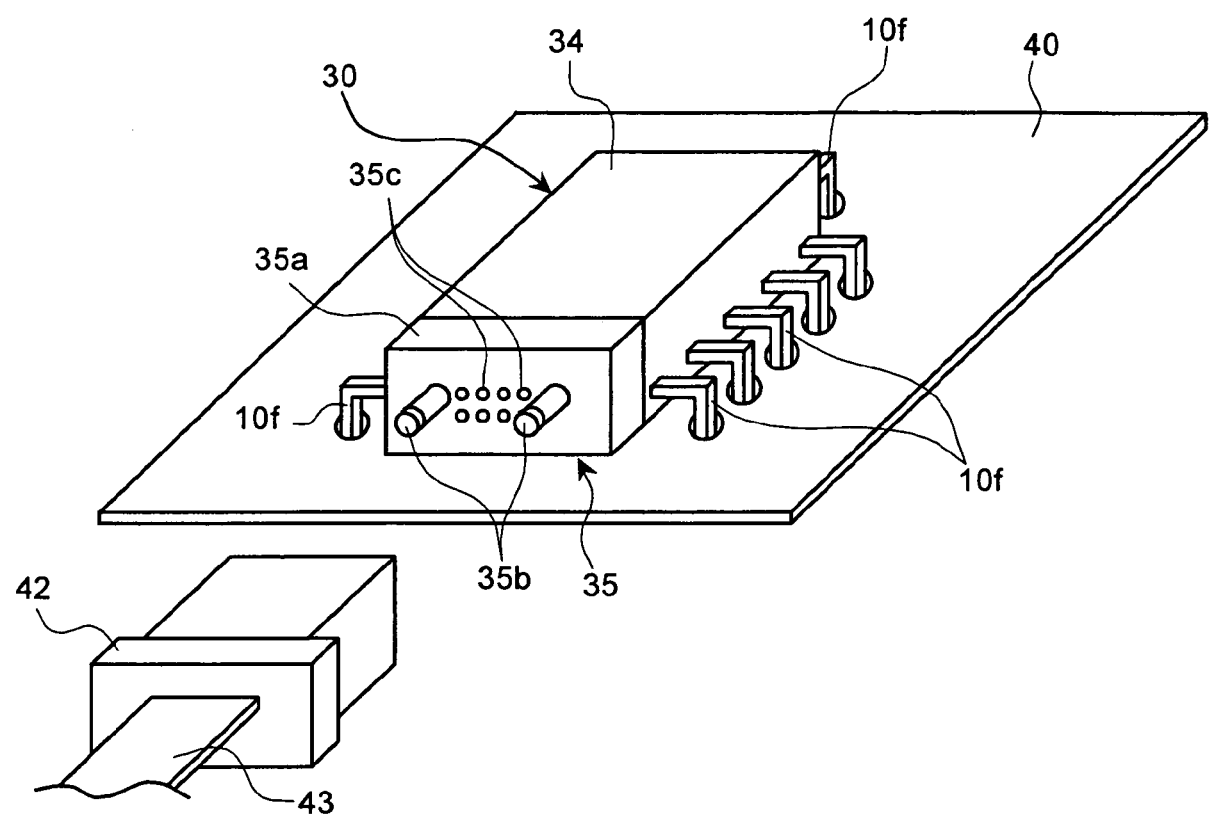
FIG. 12B is a perspective view of another state of the optical module.

As indicated by the optical module 30 shown in FIG. 12B, in another form of an optical module, the bent leads 10f are substantially L-shaped, the leads 10f are inserted and fixed in through-holes provided in predetermined positions of the circuit board 40, and the optical module 30 is electrically connected to the predetermined circuit. In addition, in the optical module 30 shown in FIG. 12B, the plural optical semiconductor elements 32 are arranged in a two-dimensional direction within a plane in a predetermined position. In other words, the optical module 30 shown in FIG. 12B has two columns of the four optical semiconductor elements 32, which are arranged in a row, in a vertical direction. Therefore, in the ferrule 35, as shown in FIG. 12B, two columns of the four optical fibers 35c, which are arranged in a row, are arranged in a vertical direction in the body 35a in association with the two columns of the optical semiconductor elements 32 arranged vertically.

The plural optical semiconductor elements 32 may be arranged in the two-dimensional direction, respectively, for example, in a total number of twelve consisting of two in the longitudinal direction multiplied by six in the lateral direction, total number of nine consisting of three in the longitudinal direction multiplied by three in the lateral direction, or in a larger number.

Note that the leads 10f may be parallel to a surface of the circuit board 40 without being bent. For example, if a hole capable of housing the optical module is provided in a predetermined position of the circuit board 40 and the optical module is moved to a position where the leads 10f and wiring of the circuit board 40 are electrically connectable, the leads 10f do not have to be bent. In addition, by providing, for example, a wiring stand for laying wiring to a position where the leads 10f and the wirings of the circuit board 40 are electrically connectable, the leads 10f do not have to be bent. In this way, it is possible to design a shape of the leads 10f arbitrarily.

Consequently, in the optical module 30, for example when the optical semiconductor element 32 is a VCSEL, as shown in FIG. 11A, a drive current inputted from the circuit board 40 side flows through a route passing the lead 10f at the right end, the via-hole 11a, the bonding wire W, the electronic circuit component 33, the bonding wire W, the via-hole 11a, the conductor plate strip 10h, the bonding wire W, the mounting block 31, the bonding wire W, and the optical semiconductor element 32. Light emitted from the optical semiconductor element 32 is transmitted by the ribbon type optical fiber 43 attached to the multi-core connector 42.

When the optical semiconductor element 32 is a planar PD, an optical signal current generated in the optical semiconductor element 32 is guided to an external circuit through a route opposite to the route described above.

As described above, in the optical module 30, the substrate B, in which the conductor layer 10c is integrally formed on the conductor plate 10a via the insulating layer 10b, is subjected to any one of etching and laser abrasion or both to form the wiring section PW and any one of the lead section PL and the mounting section PM or both simultaneously. These respective sections are electrically connected by the via-holes 11a. Consequently, in the optical module 30, since wire bonding sections are reduced compared with the conventional optical module, an influence of fluctuation in inductance due to fluctuation or the like in a length of the bonding wires W decreases. In addition, since the wiring patterns 10d can be formed highly accurately and without fluctuation, impedance characteristics are stabilized and deterioration in a signal transmission characteristic is controlled. There is an advantage that the optical module 30 can be manufactured at low cost because the optical module 30 is easily machined.

The planar optical semiconductor element 32 is fixed to the first surface 31a of the mounting block 31 and joined to the stepped portion 21a on the second surface 31b perpendicular to the first surface 31a, whereby the substrate surface thereof is perpendicular to the upper surface of the conductor plate 10a. Consequently, it is possible to make a direction of light made incident on and emitted from the optical fibers 35c and a direction of light made incident on and emitted from the planar optical semiconductor element 32 the same. At the same time, both ends of the bonding wire W, which electrically connects the planar optical semiconductor element 32 and the conductor plate strip 10h, are bonded to the first surface 31a of the mounting block 31 and the facet 10j of the conductor plate strip 10h substantially parallel to the first surface 31a. Thus, it is possible to perform wire bonding work efficiently.

Figure 14:
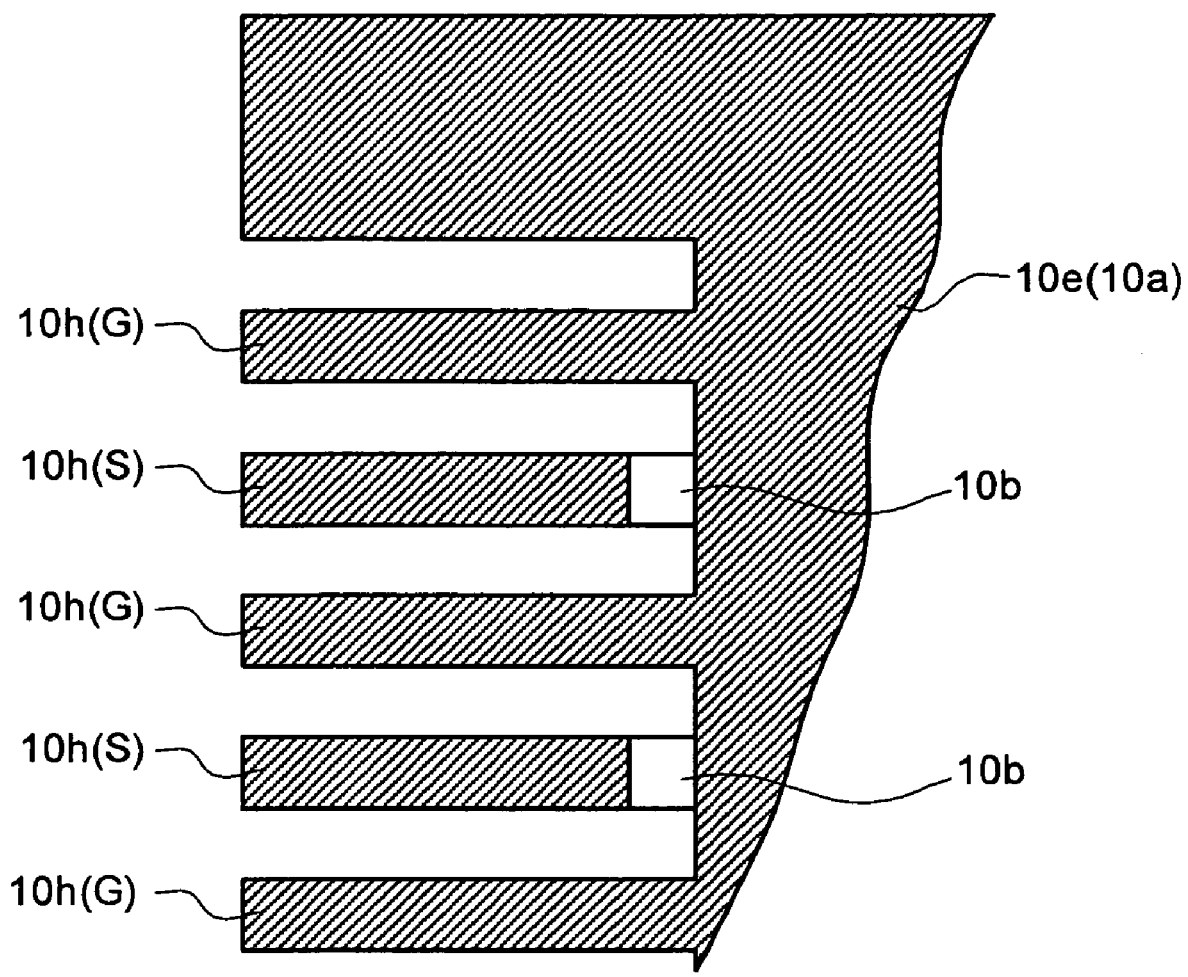
FIG. 14 is a bottom view of a mounting section viewed from a lower surface side thereof in FIG. 13.
Figure 15A:
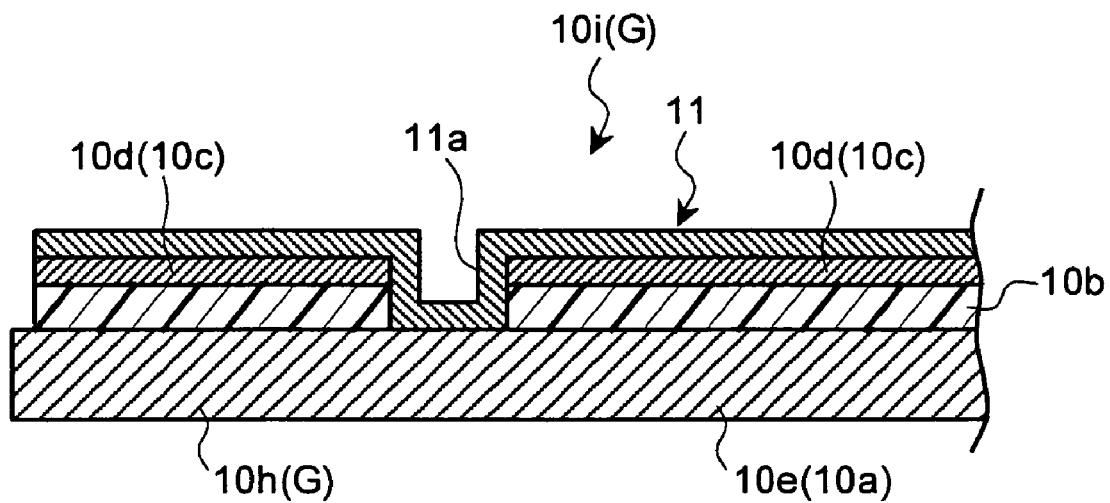
FIG. 15A is a sectional view along a ground electrode strip in FIG. 13.
Figure 15B:
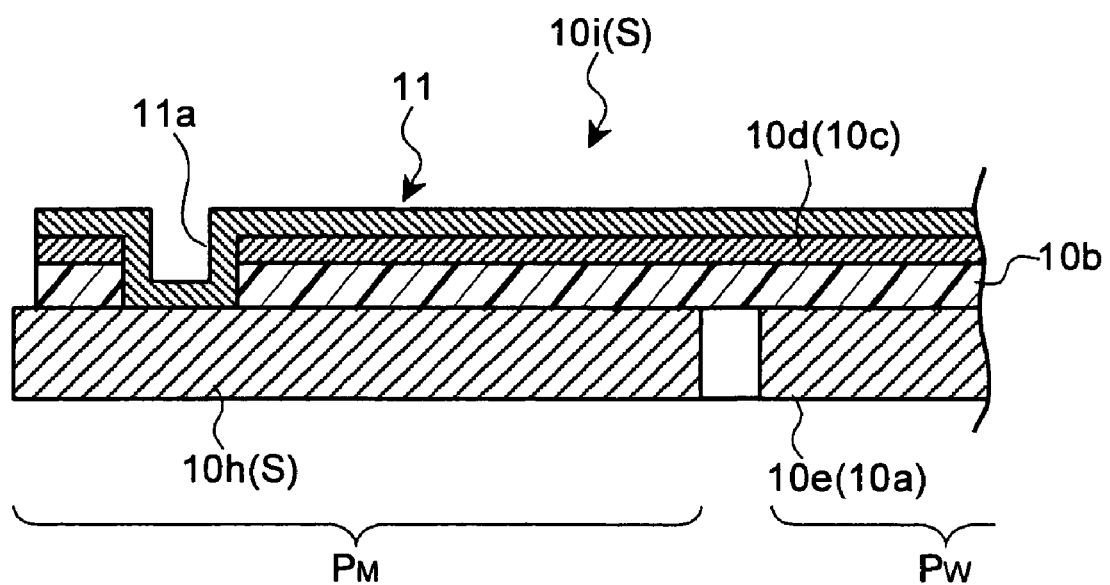
FIG. 15B is a sectional view along a signal electrode strip.

FIG. 13 is a perspective view of the printed wiring board 10, the electronic circuit component 33, and the bonding wires W in the optical module 30. The plural leads 10f of the lead section PL are bent. Note that, in FIG. 13, the metal plating layer 11 is not shown in the figure. FIG. 14 is a bottom view of the mounting section PM in FIG. 13 viewed from a lower surface side thereof. FIG. 15A is a sectional view along a ground electrode strip 10i(G) in plural electrode strips shown in FIG. 13. FIG. 15B is a sectional view along a signal electrode strip 10i(S).

As shown in FIGS. 14, 15A, and 15B, a ground electrode strip 10i(G), which includes a ground conductor plate strip 10h(G) continuously extending from the conductor plate 10a (the wiring section ground 10e) of the wiring section PW to the mounting section PM, the insulating layer 10b stacked astride the mounting section PM and the wiring section PW on the ground conductor plate strips 10h(G), and the wiring patterns (the ground electrode patterns) 10d formed on this insulating layer 10b, is disposed between adjacent signal electrode strips 10i(S) of the mounting section PM. In this way, the respective signal electrode strips 10i(S) and the ground electrode strips 10i(G) are arranged alternately to form plural electrode strips 10i. Note that only two signal electrode strips 10i(S) are shown in the figures for simplification of the explanation.

As shown in FIG. 15A, the ground conductor plate strip 10h(G) of the ground electrode strip 10i(G) is electrically connected to the wiring patterns (the ground electrode patterns) 10d, which lead to the wiring section PW, via the via-hole 11a. In addition, as shown in FIG. 15B, the signal conductor plate strip 10h(S) of the signal electrode strip 10i(S) is electrically connected to the wiring patterns (the signal electrode patterns) 10d, which lead to the wiring section PW, via the via-hole 11a. Consequently, in the ground electrode strip 10i(G), both the ground conductor plate strip 10h(G) and the wiring patterns (the ground electrode patterns) 10d formed on the ground conductor plate strip 10h(G) are electrically connected to the wiring section ground 10e. On the other hand, in the signal electrode strip 10i(S), the signal conductor plate strip 10h(S) and the wiring patterns (the signal electrode patterns) 10d formed on the signal conductor plate strip 10h(S) lead to the wiring patterns 10d of the wiring section PW without being electrically connected to the wiring section ground 10e.

In the printed wiring board 10, as shown in FIGS. 13 to 15, since the ground electrode strip 10i(G) includes the ground conductor plate strip 10h(G) that is continuously formed integrally with the wiring section ground 10e, a ground potential of the printed wiring board 10 is stabilized. Therefore, the plural signal electrode strips 10i(S) are electromagnetically shielded from one another effectively by arranging the signal electrode strips 10i(S) among the ground electrode strips 10i(G). Consequently, in the optical module 30 using the printed wiring board 10, since electromagnetic interference among the signal electrode strips 10i(S) is controlled effectively, crosstalk among channels is controlled effectively and deterioration in a signal transmission characteristic, for example, an S/N ratio is controlled or prevented.

In manufacturing the printed wiring board 10, It is possible to form such a ground electrode strip 10i(G) simultaneously with formation of the signal electrode strip 10i(S). In other words, in separating the mounting section PM into the plural electrode strips 10i by etching the conductor plate 10a, an etching mask only has to be formed such that a portion to be the ground conductor plate strip 10h(G) is not separated from the conductor plate 10a (the wiring section ground 10e) of the wiring section PW, that is, the portion is not separated into the second portion on the wiring section PW side and the third portion on the mounting section PM side. In this way, it is possible to form the ground electrode strip 10i(G) with a very simple method.

Note that, in the above explanation, the ground electrode strip 10*i*(G) is formed in the electrode strip 10*i* in the mounting section PM. Similarly, concerning the leads 10*f* in the lead section PL, it is possible to dispose the ground lead 10*f*(G), which is continuously formed integrally with the wiring section ground 10*e*, between the signal leads 10*f*(S). With such a structure, in the optical module 30, a ground potential of the ground lead 10*f*(G) is stabilized and it is possible to electrically shield the adjacent signal leads 10*f*(S) with the ground lead 10*f*(G) effectively. Therefore, in the optical module 30, since electromagnetic interference in the lead section PL caused by a signal transmitted from the circuit board 40 shown in FIG. 12A is controlled or prevented effectively, crosstalk among channels is controlled and deterioration in a signal transmission characteristic, for example, an S/N ratio is controlled or prevented.

In this case, like the ground electrode strip 10*i*(G), the ground lead 10*f*(G) includes the conductor plate 10*a* continuously extending from the conductor plate 10*a* (the wiring section ground 10*e*) of the wiring section PW to the lead section PL. In manufacturing the printed wiring board 10, it is possible to form the ground lead 10*f*(G) simultaneously with formation of the signal lead 10*f*(S). In other words, in separating the mounting section PM into the plural leads 10*f* by etching the conductor plate 10*a*, an etching mask only has to be formed such that a portion to be the ground lead 10*f*(G) is not separated from the conductor plate 10*a* (the wiring section ground 10*e*) of the wiring section PW, that is, the portion is not separated into the second portion on the wiring section PW side and the first portion on the lead section PL side.

Figure 20:
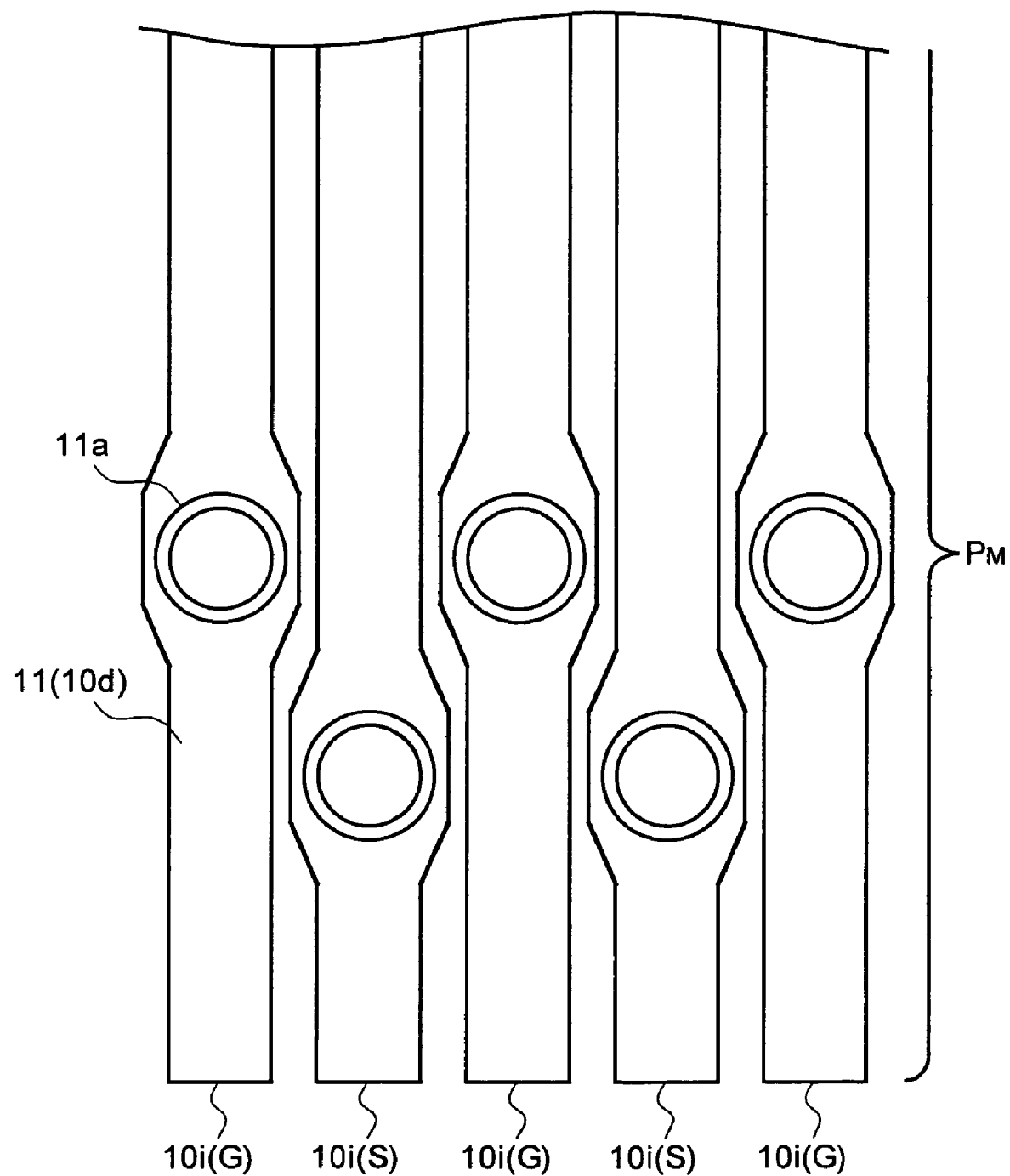
FIG. 20 is an enlarged diagram of a mounting section PM in FIG. 13 viewed from a position above the mounting section PM.

FIG. 20 is an enlarged diagram of an example of the mounting section PM in FIG. 13 from a position above the mounting section PM. As shown in FIG. 20, in the plural electrode strips 10*i* of the mounting section PM, the via-holes 11*a* electrically connecting the wiring patterns 10*d* and the conductor plate strips 10*h* are formed to be in different positions in a longitudinal direction of the electrode strips 10*i* between the adjacent electrode strips 10*i*. To make it sure that the wiring patterns 10*d* and the conductor plate strips 10*h* are electrically connected, the via-holes 11*a* are required to be large to a certain extent. A diameter of the via-holes 11*a* is larger than widths of the wiring patterns 10*d* and the conductor plate strips 10*h*. Therefore, when the via-holes having such a large diameter are arranged in an identical position in the longitudinal direction of the electrode strips 10*i*, a pitch among the respective electrode strips 10*i* increases and does not match a pitch among channels in a multi-channel optical semiconductor element that is manufactured according to a pitch (e.g., 250 micrometers) of an optical fiber array to be usually adopted. Thus, by shifting positions of the via-holes 11*a* between the adjacent electrode strips 10*i*, such a problem is avoided to make it possible to reduce the pitch among the electrode strips 10*i*. This makes it possible to manufacture the optical module 30 of a small size using the printed wiring board 10 of the present invention. Note that it is possible to design a pitch of optical fiber arrays arbitrarily according to a type of an optical fiber, for example, a diameter, a shape (a sectional shape, a multi-core type like an optical cable or a ribbon shape, etc.), or the like.

Figure 16:
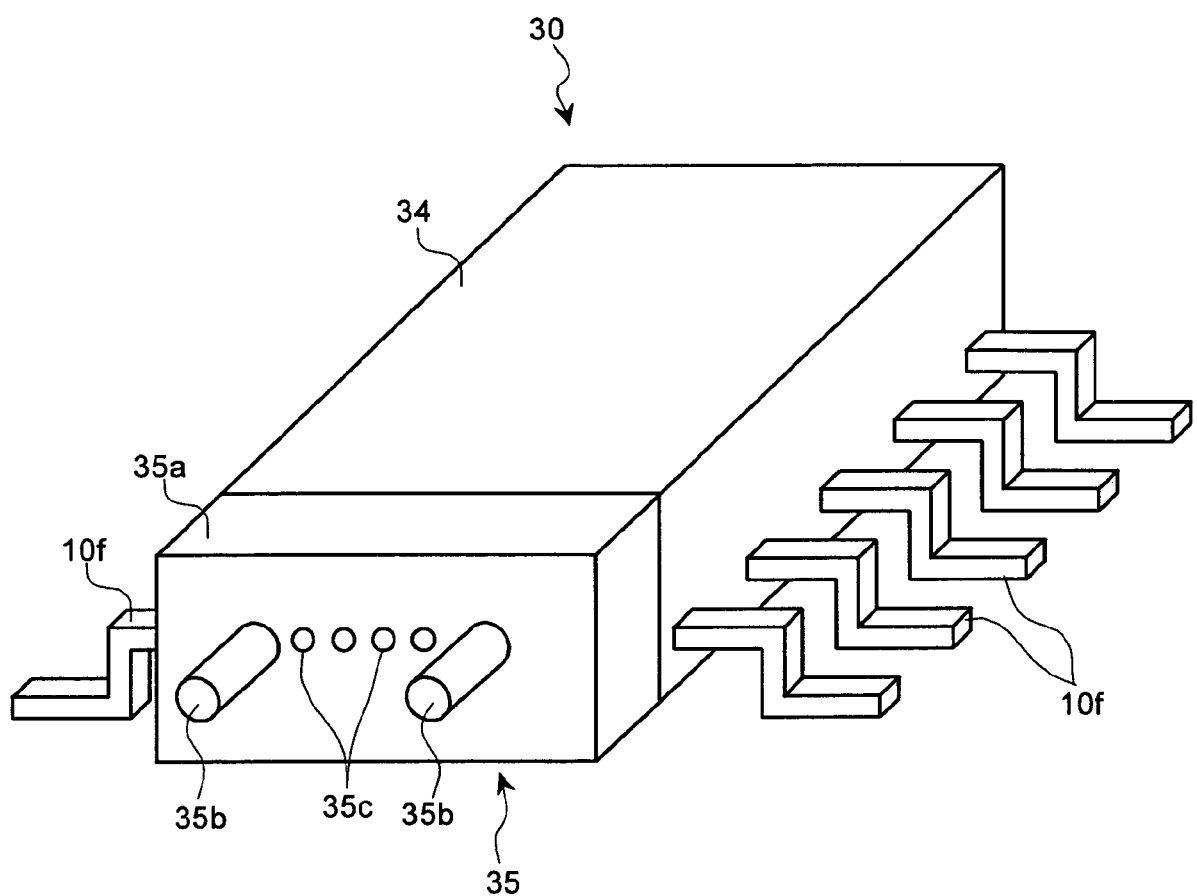
FIG. 16 is a sectional view of a modification of the optical module according to the third embodiment.

In the optical module 30, the plural leads 10*f* extend in three directions; both sides in the width direction and the rear to be a back side with respect to the front where the guide pints 35*b* are provided. However, depending on an application or a design, as shown in FIG. 16, the leads 10*f* may extend only to both sides in the width direction. In addition, the leads 10*f* may extend only from one side in the width direction or from the lower surface of the optical module 30.

Figure 18A:
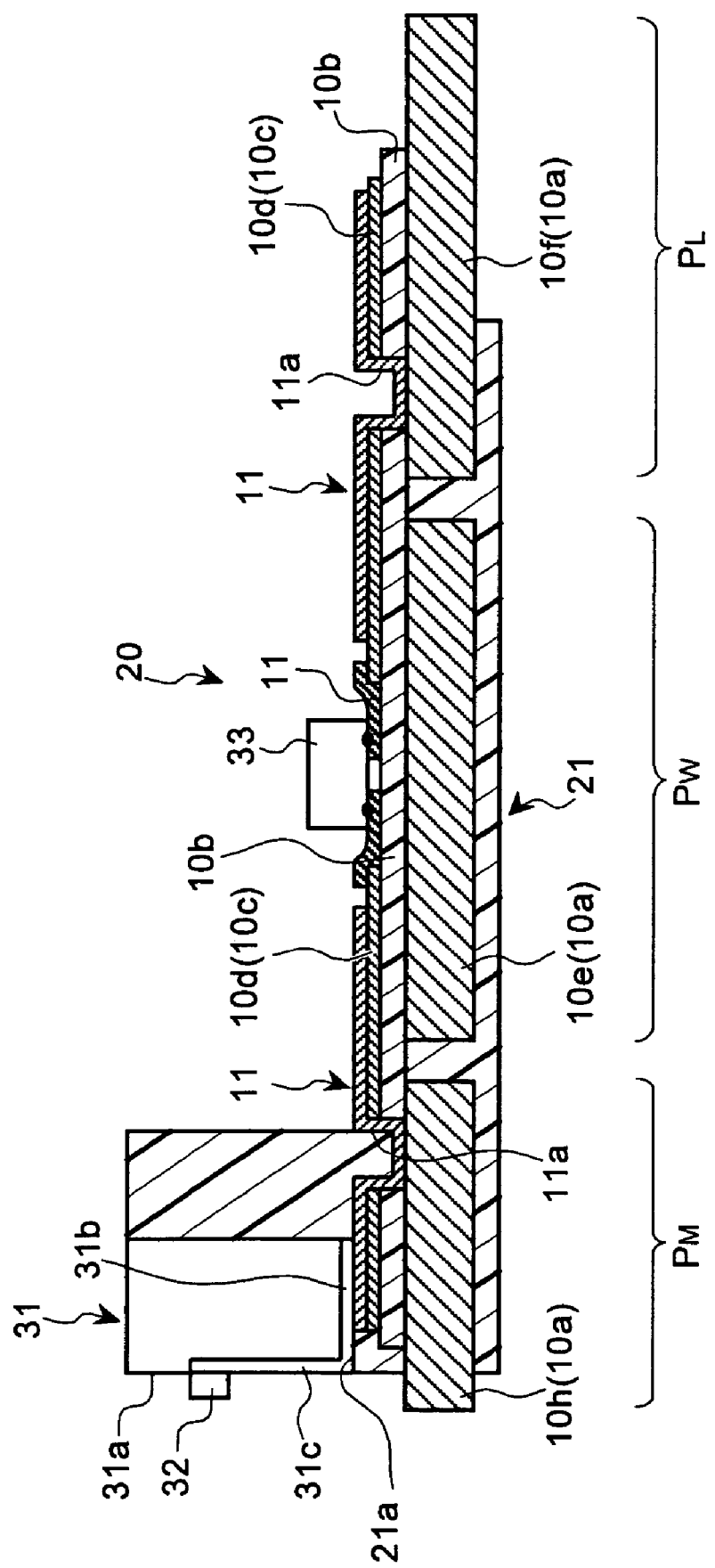
FIG. 18A is a sectional view of an example in which an optical module is constituted without using a bonding wire.

As shown in FIG. 18A, in the optical module 30, a wiring pattern 31*c* connecting the optical semiconductor element 32 and the wiring pattern 10*d* may be formed to extend continuously on the first surface 31*a* of the mounting block 31, to which the optical semiconductor element 32 is fixed, and the second surface 31*b* perpendicular to the first surface 31*a*. In a state in which the wiring pattern 31*c* on the second surface 31*b* of the mounting block 31 is in contact with the wiring pattern 10*d* (the metal plating layer 11) of the mounting section PM of the printed wiring board 10, the mounting block 31 may be fixed on the printed wiring board 10.

Figure 18B:
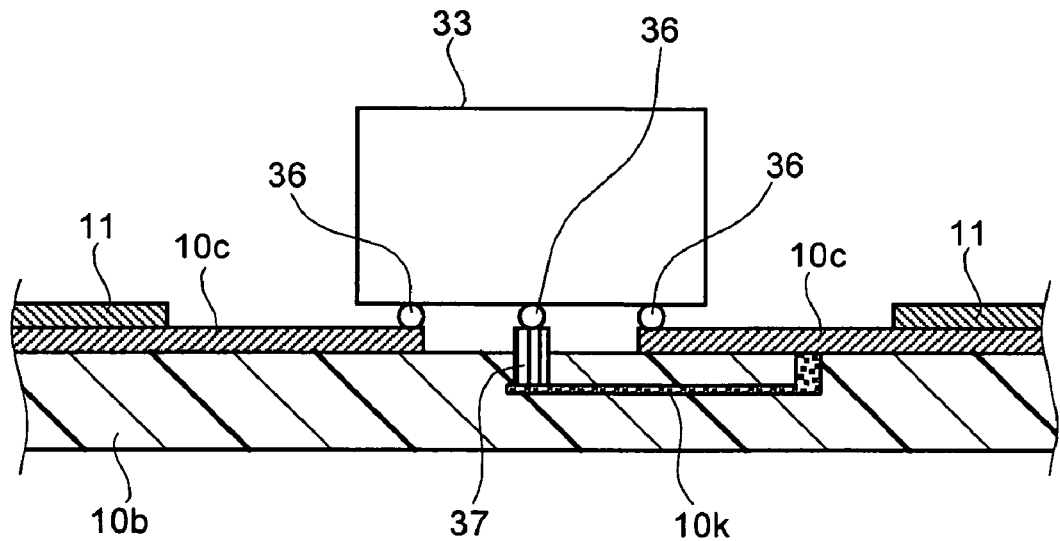
FIG. 18B is a sectional view of a state of connection of electrodes and a via-hole in an electronic circuit component (a semiconductor element) in FIG. 18A.

Note that, when the electronic circuit component 33 is connected to the conductor layers 10*c*, which change to the wiring patterns 10*d*, within a plane via plural electrodes arranged on the plane, as shown in FIG. 18B, the electronic circuit component 33 is connected to the conductor layers 10*c* via solder bumps 36 corresponding to the electrodes.

Figure 18C:
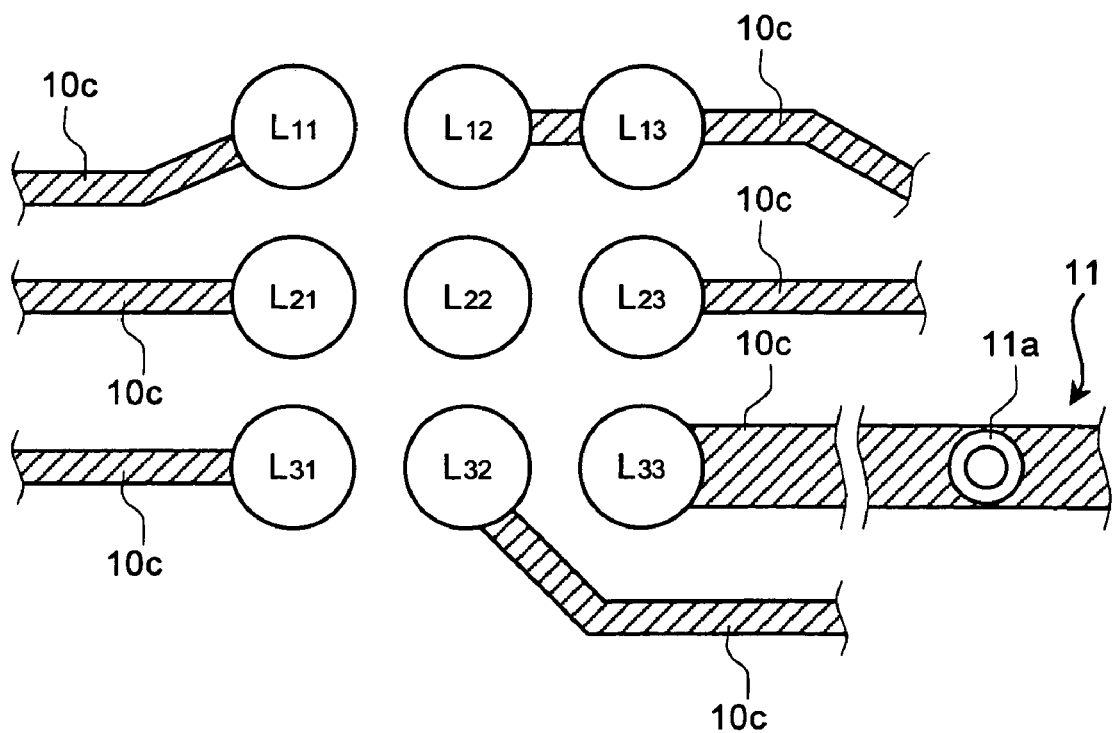
FIG. 18C is a plan view of an example of fixed positions of electrodes and a conductor layer to be a wiring pattern in the electronic circuit component (the semiconductor element)

In this case, as shown in FIG. 18C, when the number of connecting positions L11 to L33 of the respective plural electrodes and the respective plural conductor layers 10*c* is nine consisting of three in the longitudinal direction multiplied by three in the lateral direction or more, the conductor layers 10*c* are present in the respective connecting positions L11 to L33. Thus, in the connecting position L22 surrounded by the other connecting positions L11 to L33, it is difficult to provide the conductor layer 10*c* because of limitation of a space. Therefore, when the electronic circuit component 33 has the connecting position L22 surrounded by the other connecting positions L11 to L33, as shown in FIG. 18B, in the connecting position L22, the electronic circuit component 33 is connected to a conductor layer 10*k* through a via-hole 37. Consequently, in the electronic circuit component 33, an electrode in the connecting position L22 is connected to the wiring pattern 10*d* (the conductor layer 10*c*) via the solder bump 36, the via-hole 37, and the conductor layer 10*k*.

In this case, the electronic circuit component 33 may be connected using a through-hole instead of the via-hole 37 or the solder bump 36, and the conductor layer 10*k* may be connected directly. In this way, it is possible to connect the electronic circuit component 33 with the conductor layer even if the number of electrodes increases and connecting positions surrounded by other connecting positions are present. The conductor layer 10*k* itself may form a wiring pattern like the wiring pattern 10*d* such that desired wiring is possible or may be electrically connected to a predetermined wiring pattern such as the via-hole 11*a*.

Figure 19A:
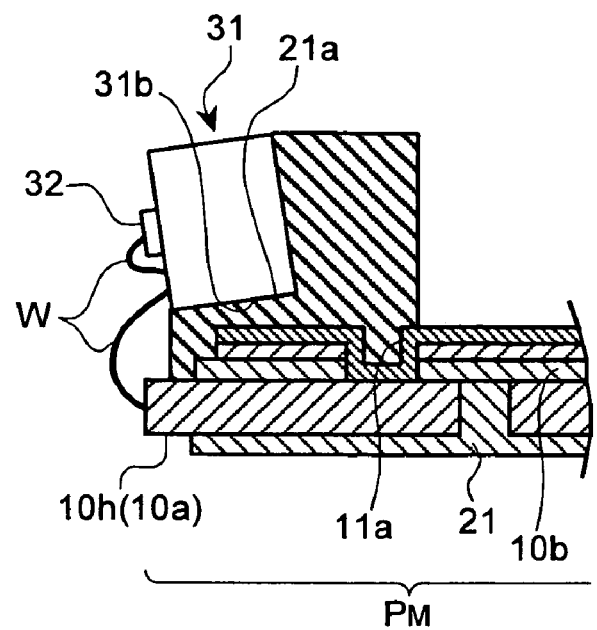
FIG. 19A is a diagram of another form of a mounting section.
Figure 19B:
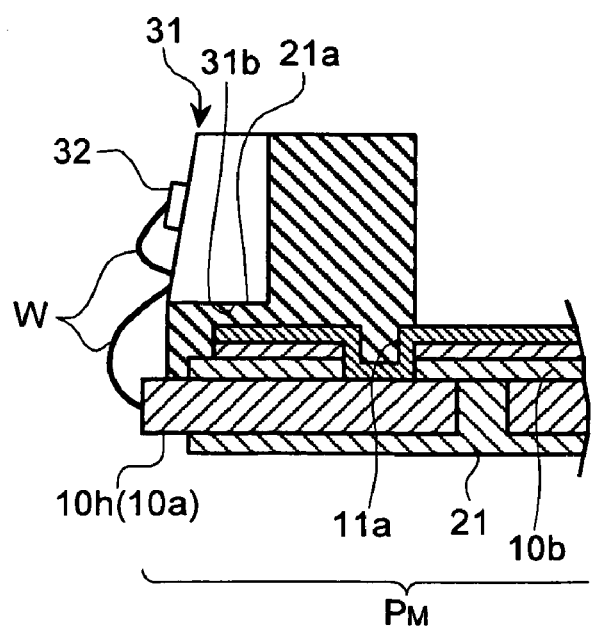
FIG. 19B is a diagram of still another form of the mounting section.

Moreover, to control an influence of reflected light on the surface of the planar optical semiconductor element 32, as shown in FIG. 19A, it is also possible that the stepped portion 21*a* is formed on a slope having an inclination of about 3° to 10°, preferably, 6° to 9° with respect to the upper surface of the conductor plate 10*a*, whereby the substrate surface of the planar optical semiconductor element 32 fixed to the first surface 31*a* of the mounting block 31 is not perpendicular to the upper surface of the conductor plate 10*a*. In addition, as shown in FIG. 19B, it is also possible that the mounting block 31 is constituted such that the first surface 31*a* and the second surface 31*b* of the mounting block 31 cross at an angle except a right angle and the second surface 31*b* is fixed to the stepped portion 21 formed in parallel to the upper surface of the conductor plate 10*a*, whereby the substrate surface of the planar optical semiconductor element 32 is not perpendicular to the upper surface of the conductor plate 10a. Moreover, although not shown in the figure, the mounting block 31 may be fixed to the stepped portion 21a in a position to which the mounting block 31 is rotated about 3° to 10°, preferably, 6° to 9° around an axis perpendicular to the upper surface of the conductor plate 10a, or an incidence and exit facet of the optical fiber 35c may be machined obliquely. According to the structure described above, in the optical module 30, since an incidence and exit surface (parallel to the substrate surface) of the planar optical semiconductor element 32 and the incidence and exit facet of the optical fiber 35c are not parallel to each other, an adverse influence due to reflected light is controlled or prevented.

In the optical module 30, the electronic circuit component 33 like an IC for driving the optical semiconductor element 32 may be fixed to the wiring section PW by flip-chip bonding. According to such a structure, since it is possible to further reduce bonding wires that connect the electronic circuit component 33 and the wiring pattern 10d of the wiring section PW of the printed wiring board 10, in the optical module 30, it is possible to further control the deterioration in a signal transmission characteristic.

Note that, in the optical module 30 of the present invention, the electronic circuit component 33 does not have to be provided and the lead 10f of the lead section PL and the optical semiconductor element 32 mounted on the mounting section PM may be connected without the intervention of the electronic circuit component 33. In addition, in the printed wiring board 10, the mounting section PM is not indispensable and only the wiring section PW and the lead section PL may be provided. In this case, as shown in FIG. 17, the optical semiconductor element 32 like an edge emitting semiconductor laser diode or a waveguide (an edge receiving) photodiode only has to be fixed on the metal plating layer 11 of the wiring section PW to connect the optical semiconductor element 32 and the wiring pattern 10d with the bonding wire W.

FIG. 21 is a sectional view of an optical module 50 according to a fourth embodiment of the present invention. In the optical module 30 according to the third embodiment, the lead frame package 20 mounted with the optical semiconductor element 32 and the electronic circuit component (the semiconductor element) for driving 33 is sealed with electrically insulating synthetic resin. On the other hand, in the optical module 50, the lead frame package 20 mounted with the optical semiconductor element 32 and the electronic circuit component for driving 33 is sealed by a lid 51, a sidewall 52, a bottom plate 54, and a ferrule 55. It is desirable that the inside of the optical module 50 is sealed with a nitrogen gas ($N_2$), a gas with a controlled amount of moisture, or the like.

In the optical module 50, as shown in FIG. 21, a fixing member 53 with conductor plates 10e, 10f, and 10h fixed thereon is fixed to the bottom plate 54, and the conductor plate 10f extends to the outside from the sidewall 52 via an insulator 56. In this case, the optical module 50 includes the plural optical semiconductor elements 32 arranged in a row. Plural leads 33a of the electronic circuit component 33 is joined with the conductor layer 10c by soldering. Therefore, the ferrule 55 includes plural optical fibers 55c in a number corresponding to the number of the optical semiconductor elements 32. The respective optical fibers 55c are optically coupled to channels of the respective optical semiconductor elements 32. The optical module 50 is connected to a multi-core connector (not shown) using guide pins 55b provided in a body 55a of the ferrule. The optical semiconductor elements 32 are optically coupled to optical fibers of the multi-core connector via the optical fibers 55c.

In this case, it is desirable that the fixing member 53 has electrically insulating properties and thermal conductivity at least in portions where the fixing member 53 is in contact with the conductor plates 10e, 10f, and 10h. When the fixing member 53 has thermal conductivity, the optical module 50 is capable of radiating and applying heat via the bottom plate 54. Metal formed with an electrically insulating layer, heat conductive synthetic resin, or nonmetal like alumina ($Al_2O_3$) or aluminum nitride (AlN) is used for the fixing member 53 at least in the portions where the fixing member 53 is in contact with the conductor plates 10e, 10f, and 10h. On the other hand, it is possible to use metal such as copper or copper alloy, heat conductive synthetic resin, or nonmetal such as alumina ($Al_2O_3$) or aluminum nitride (AlN) for the bottom plate 54.

In the optical module 50, a temperature control element is placed between the fixing member 53 and the bottom plate 54 to make it possible to control, for example, the optical semiconductor elements 32 and the electronic circuit component 33 to have desired temperatures from the outside according to a temperature change. Moreover, if a temperature sensor is provided in a predetermined position inside the optical module 50, it is possible to control temperature more accurately.

Note that the optical module of the present invention is optically coupled to respective channels of optical semiconductor elements by optical fibers provided in a ferrule and is connected to optical components like an optical connector in the outside by the ferrule. However, in the optical module of the present invention, for example, the optical fibers provided in the ferrule may be elongated. The optical fibers may be optically coupled to the respective channels of the optical semiconductor elements and lead to the outside. In this case, the optical fibers lead to the outside are optically coupled to other optical fibers by an optical connector provided at an end thereof or optically coupled to the other optical fibers by fusion bonding.

In the case of an optical module including a light-emitting element and a light-receiving element, a light-receiving signal, which is received by the light-receiving element and converted into electricity, is small compared with a magnitude of a light-emitting signal of electricity for causing the light-emitting element to emit light. Thus, electromagnetic interference (crosstalk) may occur between the light-emitting signal and the light-receiving signal. Therefore, in such an optical module, for example, plural conductor plates may be provided such that a ground for the light-emitting element and a ground for the light-receiving element are separated.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A printed wiring board comprising:
   a plurality of conductor plates that includes at least one conductor plate to be used as a lead for electrical connection with an external circuit, the plurality of conductor plates being separated spatially from one another;
   an insulating layer formed on and/or across the plurality of conductor plates;
   a plurality of wiring patterns formed on the insulating layer;

a lead section including one of the plurality of conductor plates separated; and a wiring section including another one of the plurality of conductor plates separated, the wiring section being electrically connected with the lead section; and a mounting section having another one of the plurality of conductor plates separated, wherein a recess that reaches one of the plurality of conductor plates is formed on the insulating layer, a copper plating layer is formed on the recess and on one of the plurality of wiring patterns that corresponds to the one of the plurality of conductor plates to form a via-hole, the one of the plurality of conductor plates is electrically connected with a corresponding one of the plurality of wiring patterns through the via-hole, the conductor plate of the mounting section is further separated into a predetermined number of signal conductor plate strips to constitute a plurality of signal electrode strips together with an insulating layer stacked on the signal conductor plate strips and electrode patterns formed on the insulating layer, the signal conductor plate strips are electrically connected to the corresponding electrode patterns, respectively through the via-hole, the mounting section further includes at least one ground electrode strip being arranged between two adjacent signal electrode strips from among the plurality of signal electrode strips, and the at least one ground electrode strip includes a ground conductor plate strip formed integrally with the conductor plate of the wiring section, an insulating layer stacked on the ground conductor plate strip, and a ground electrode pattern formed on the insulating layer, and the ground conductor plate strip is electrically connected with the ground electrode pattern through the via-hole.

2. The printed wiring board according to claim 1, wherein the conductor plate of the lead section is further separated into a predetermined number of signal leads corresponding to the wiring patterns, and the signal leads are electrically connected to the corresponding wiring patterns, respectively, through the via-hole.

3. The printed wiring board according to claim 2, wherein the lead section further includes at least one ground lead arranged between two adjacent signal leads, the at least one ground lead being formed integrally with the conductor plate of the wiring section, and electrically connected with a corresponding wiring pattern from among the plurality of wiring patterns.

* * * * *